(12) United States Patent
Jang et al.

(10) Patent No.: US 11,897,171 B2
(45) Date of Patent: Feb. 13, 2024

(54) CURING-DEVICE

(71) Applicant: LG INNOTEK CO., LTD., Seoul (KR)

(72) Inventors: Chul Ho Jang, Seoul (KR); Seung Beom Jeong, Seoul (KR); Do Yub Kim, Seoul (KR); Yeong Seok Yu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1144 days.

(21) Appl. No.: 16/477,276

(22) PCT Filed: Jan. 12, 2018

(86) PCT No.: PCT/KR2018/000641
§ 371 (c)(1),
(2) Date: Jul. 11, 2019

(87) PCT Pub. No.: WO2018/131948
PCT Pub. Date: Jul. 19, 2018

(65) Prior Publication Data
US 2020/0031026 A1    Jan. 30, 2020

(30) Foreign Application Priority Data

Jan. 13, 2017 (KR) .................. 10-2017-0005926
Jan. 20, 2017 (KR) .................. 10-2017-0009756
Jan. 12, 2018 (KR) .................. 10-2018-0004453

(51) Int. Cl.
*B29C 35/08* (2006.01)
*F21V 29/56* (2015.01)
(Continued)

(52) U.S. Cl.
CPC .......... *B29C 35/0805* (2013.01); *B29C 35/00* (2013.01); *B29C 35/002* (2013.01);
(Continued)

(58) Field of Classification Search
CPC ... B29C 35/0805; B29C 64/277; B29C 35/00; B29C 35/002; B29C 35/0894;
(Continued)

(56) References Cited

U.S. PATENT DOCUMENTS 8,111,371 B2 * 2/2012 Suminoe ................ H05B 45/40
349/1
10,052,888 B1 * 8/2018 Condello ........... B41J 11/00214
(Continued)

FOREIGN PATENT DOCUMENTS

JP   2009-061702    3/2009
JP   2012-256754   12/2012
(Continued)

OTHER PUBLICATIONS

International Search Report (with English Translation) and Written Opinion dated Apr. 20, 2018 issued in Application No. PCT/KR2018/000641.

(Continued)

*Primary Examiner* — Bao Q Truong
(74) *Attorney, Agent, or Firm* — KED & ASSOCIATES, LLP

(57) ABSTRACT

According to an embodiment, disclosed is a curing-device comprising: a stage; a light emitting module including a substrate disposed on the stage and a plurality of light emitting elements disposed on the substrate; and a plurality of transparent blocks disposed between the light emitting module and the stage, wherein the substrate includes a plurality of first sections and a plurality of second sections which are disposed in a first direction, the intervals in the first direction between the light emitting elements disposed in the first sections is smaller than the intervals in the first direction between the light emitting elements disposed in the
(Continued)

second sections, and the plurality of transparent blocks are disposed on the first sections.

20 Claims, 33 Drawing Sheets

(51) Int. Cl.
    *H05B 47/105*     (2020.01)
    *B29C 35/00*     (2006.01)
    *H01L 25/075*     (2006.01)
    *B29C 64/277*     (2017.01)
    *B29C 35/16*     (2006.01)
    *F21V 29/51*     (2015.01)
    *H05B 45/28*     (2020.01)

(52) U.S. Cl.
    CPC .......... *B29C 35/0894* (2013.01); *B29C 35/16* (2013.01); *B29C 64/277* (2017.08); *F21V 29/51* (2015.01); *F21V 29/56* (2015.01); *H01L 25/0753* (2013.01); *H05B 45/28* (2020.01); *H05B 47/105* (2020.01); *B29C 2035/0827* (2013.01)

(58) Field of Classification Search
    CPC ............ B29C 35/16; B29C 2035/0827; B29C 35/0266; B29C 35/0288; F21V 29/51; F21V 29/56; H05B 45/28; H05B 47/105; H05B 33/12; H01L 25/0753; H01L 21/67115
See application file for complete search history.

(56) References Cited

U.S. PATENT DOCUMENTS

2007/0184141 A1*  8/2007  Custer .................. B41J 11/0021
                                                               425/174
2010/0271565 A1  10/2010  Suminoe et al.
2020/0003354 A1*  1/2020  Kanres .................... F16L 55/18

FOREIGN PATENT DOCUMENTS

| JP | 2013-094737 | 5/2013 |
| KR | 10-2005-0027360 | 3/2005 |
| KR | 10-2011-0117444 | 10/2011 |
| KR | 10-2011-0117445 | 10/2011 |
| KR | 10-2016-0021470 | 2/2016 |
| KR | 10-2016-0034792 | 3/2016 |
| WO | WO 2009/016913 | 2/2009 |

OTHER PUBLICATIONS

Chinese Office Action dated Jan. 28, 2021 issued in Application No. 201880007028.4.
Korean Office Action dated Oct. 26, 2021 issued in Application No. 10-2018-0004453.
Korean Office Action dated Dec. 28, 2023 issued in Application No. 10-2017-0005926.
Korean Office Action dated Dec. 28, 2023 issued in Application No. 10-2017-0009756.

* cited by examiner

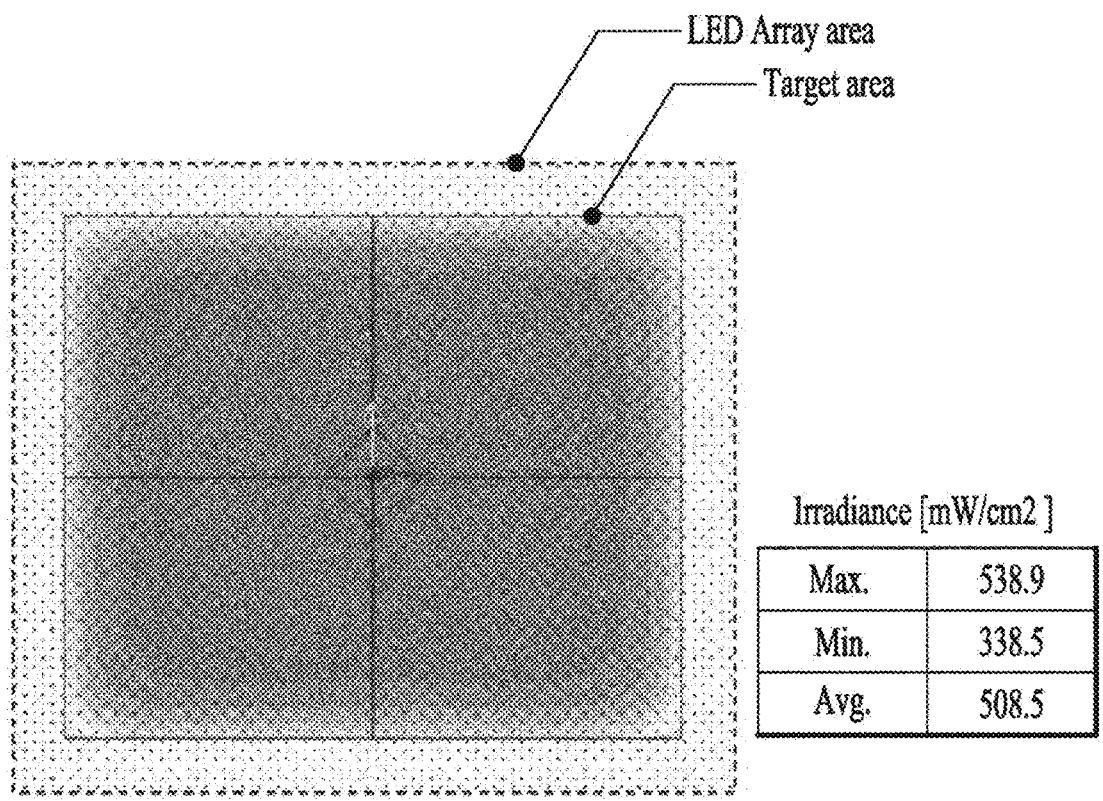

FIG. 5B

| Min/Avg | Avg/Max | Min/Max | UNI (80%↑) |
|---------|---------|---------|------------|
| 67%     | 94%     | 67%     | 80%        |

FIG. 5D

| Min/Avg | Avg/Max | Min/Max | UNI(80%↑) |
|---|---|---|---|
| 70% | 95% | 67% | 83% |

FIG. 7A

| H (mm) | Irradiance [mW/cm2] | | | Uniformity | | | |
|---|---|---|---|---|---|---|---|
| | Avg. | Min | Max | Min/Avg | Avg/Max | Min/Max | UNI |
| 50 | 553.3 | 537 | 585 | 97% | 95% | 92% | 96% |
| 60 | 547.7 | 494.3 | 561.8 | 90% | 97% | 88% | 94% |
| 70 | 541.9 | 454.5 | 553.1 | 84% | 98% | 82% | 91% |
| 80 | 535.9 | 417.5 | 551.7 | 78% | 97% | 76% | 87% |
| 90 | 530 | 390.6 | 551.6 | 74% | 96% | 71% | 85% |
| 100 | 524 | 368.1 | 550 | 70% | 95% | 67% | 83% |

FIG. 7B

| H (mm) | Irradiance [mW/cm2] | | | Uniformity | | | |
|---|---|---|---|---|---|---|---|
| | Avg. | Min | Max | Min/Avg | Avg/Max | Min/Max | UNI |
| 50 | 296.2 | 287.4 | 313.7 | 97% | 94% | 92% | 96% |
| 60 | 293.2 | 264.5 | 300.8 | 90% | 97% | 88% | 94% |
| 70 | 290.2 | 243.1 | 296.2 | 84% | 98% | 82% | 91% |
| 80 | 287 | 223.6 | 295.5 | 78% | 97% | 76% | 87% |
| 90 | 283.8 | 208.7 | 295.5 | 74% | 96% | 71% | 85% |
| 100 | 280.6 | 196.6 | 294.5 | 70% | 95% | 67% | 83% |

FIG. 7C

| H (mm) | Irradiance [mW/cm2] | | | Uniformity | | | |
|---|---|---|---|---|---|---|---|
| | Avg. | Min | Max | Min/Avg | Avg/Max | Min/Max | UNI |
| 50 | 257.2 | 247 | 274.7 | 96% | 94% | 90% | 95% |
| 60 | 254.6 | 226.9 | 263.6 | 89% | 97% | 86% | 93% |
| 70 | 251.9 | 209.3 | 257 | 83% | 98% | 81% | 91% |
| 80 | 249.2 | 192.2 | 256.5 | 77% | 97% | 75% | 87% |
| 90 | 246.4 | 179.7 | 256.2 | 73% | 96% | 70% | 84% |
| 100 | 243.6 | 169.8 | 255.6 | 70% | 95% | 66% | 82% |

CURING-DEVICE

CROSS-REFERENCE TO RELATED PATENT APPLICATIONS

This application is a U.S. National Stage Application under 35 U.S.C. § 371 of PCT Application No. PCT/KR2018/000641, filed Jan. 12, 2018, which claims priority to Korean Patent Application No. 10-2017-0005926, filed Jan. 13, 2017; Korean Patent Application No. 10-2017-0009756, filed Jan. 20, 2017; and Korean Patent Application No. 10-2018-0004453, filed Jan. 12, 2018, whose entire disclosures are hereby incorporated by reference.

TECHNICAL FIELD

Embodiments relate to an ultraviolet curing device.

BACKGROUND ART

Generally, a device for curing or adhering a curing target by irradiating the curing target with ultraviolet light is called an ultraviolet curing device. In this case, the curing target may be a paint, an adhesive, or an opaque material which is curable with ultraviolet light.

A mercury ultraviolet lamp, a halogen lamp, or the like may be used as a light source for generating ultraviolet light of an ultraviolet curing device. However, there is a problem in that these lamps are inefficient and expensive.

An ultraviolet light emitting diode (LED) may be used as a light source of an ultraviolet curing device. The ultraviolet LED has an advantage of having high efficiency, a relatively low cost, and a long service life.

However, since a plurality of ultraviolet LEDs are disposed, uniformity of irradiance is an important issue.

DISCLOSURE

Technical Problem

Embodiments are directed to providing an ultraviolet curing device with improved uniformity of irradiance.

Embodiments are also directed to providing an ultraviolet curing device which is capable of preventing degradation of uniformity of irradiance according to a variation in temperature of a light emitting element.

Problems to be solved in the embodiments are not limited to the above-described problems, and objects and effects which can be determined from the solutions and the embodiments of the problems described below are also included.

Technical Solution

One aspect of the present invention provides a curing device including a stage; a light emitting module including a substrate disposed on the stage, and a plurality of light emitting elements disposed on the substrate; and a plurality of transparent blocks disposed between the light emitting module and the stage, wherein the substrate includes a plurality of first sections and a plurality of second sections, which are disposed in a first direction, an interval of the light emitting elements disposed in the first section in the first direction is narrower than an interval of the light emitting elements disposed in the second section in the first direction, and the plurality of transparent blocks are disposed in the first section.

The plurality of transparent blocks may extend in a direction perpendicular to the first direction.

The plurality of transparent blocks may be disposed in the first section.

The plurality of first sections and the plurality of second sections may be alternately disposed in the first direction.

The plurality of first sections and the plurality of second sections may extend in a second direction perpendicular to the first direction.

The substrate may include a plurality of third sections and a plurality of fourth sections, which are disposed in the second direction perpendicular to the first direction, and an interval of the light emitting elements disposed in the third section in the second direction may be narrower than an interval of the light emitting elements disposed in the fourth section in the second direction.

Each of the plurality of fourth sections may be disposed between two third sections which are disposed on an edge of the substrate.

The plurality of third sections and the plurality of fourth sections may extend in the first direction.

The substrate may include a fifth area in which the first section intersects the third section, and the number of the plurality of light emitting elements disposed in the fifth area is largest per unit area.

An interval in the first direction and an interval in the second direction of the plurality of light emitting elements disposed in the fifth area may be the same as each other.

A ratio of an interval of the plurality of light emitting elements disposed in the second section in the first direction to an interval of the plurality of light emitting elements disposed in the first section in the first direction may be in a range of 1:0.62 to 1:0.83.

A ratio of an interval of the plurality of light emitting elements disposed in the fourth section in the second direction to an interval of the plurality of light emitting elements disposed in the third section in the second direction may be in a range of 1:0.62 to 1:0.83.

An interval of the light emitting elements disposed in the third section in the second direction may be narrower than an interval of the light emitting elements disposed in the fourth section in the second direction.

The light emitting element may include a first light emitting element configured to emit light of a first wavelength range and a second light emitting element configured to emit light of a second wavelength range which is different from the first wavelength range, and the first light emitting element and the second light emitting element may be alternately disposed in the first direction and the second direction perpendicular to the first direction.

The plurality of transparent blocks may fix a mask pattern of a curing target which is seated on the stage.

Another aspect of the present invention provides a curing device including a stage on which a curing target is disposed, a substrate which is disposed on the stage and includes a plurality of arrangement areas, and light emitting elements disposed in each of the plurality of arrangement areas, wherein the plurality of arrangement areas are adjacent to vertexes of the substrate and include first arrangement areas in which the light emitting elements are disposed in the form of a first matrix, a row and a column of the first matrix, which are closest to a corresponding vertex among the vertexes of the substrate, are defined as a first row and a first column, an order of rows and columns is defined as increasing in a direction away from the corresponding vertex, and a separation distance between two adjacent light emitting elements disposed in each of the first arrangement area is decreased as the two adjacent light emitting elements become closer to a corresponding one among the vertexes of the substrate.

The plurality of arrangement regions may further include second arrangement areas which are spaced apart from the vertexes of the substrate and are in contact with sides of the substrate, and in which the light emitting elements are disposed in the form of a second matrix.

A separation distance between two adjacent rows of the first matrix may be decreased as the two adjacent rows are close to a corresponding one among the vertexes of the substrate.

A separation distance between two adjacent columns of the first matrix may be decreased as the two adjacent columns become closer to a corresponding one among the vertexes of the substrate.

A first separation distance between the first row and a second row of the first matrix may be shorter than a second separation distance between the second row and a third row; the second separation distance, a third separation distance between the third row and a fourth row of the first matrix, and a fourth separation distance between the fourth row and a fifth row of the first matrix may be the same as each other, and the fourth separation distance may be shorter than a fifth separation distance between the fifth row and a sixth row of the first matrix.

Each of separation distances between two adjacent rows selected from among the sixth row to a last row of the first matrix may be equal to the fifth separation distance.

A sixth separation distance between the first column and a second column of the first matrix may be shorter than a seventh separation distance between the second column and a third column, the seventh separation distance may be equal to an eighth separation distance between the third column and a fourth column, the eighth separation distance may be shorter than a ninth separation distance between the fourth column and a fifth column of the first matrix, and each of the separation distances between two adjacent columns selected from among the fifth column to a last column of the first matrix may be equal to the ninth separation distance.

Separation distances between two adjacent rows of the second matrix in each of second arrangement areas in the first direction may be the same as each other, and the first direction may be a direction parallel to one side of the substrate adjacent to each of the second arrangement areas.

The columns or rows of the second matrix in each of the second arrangement areas adjacent to one side among the sides of the substrate may be aligned with the columns or rows of the first matrices in the first arrangement areas including vertexes adjacent to the one side in the first direction, and the first direction may be a direction parallel to one side of the substrate adjacent to each of the second arrangement areas.

An arrangement distance and the number of arrangements of the columns or rows of the second matrix parallel to the second direction may be the same as those of the columns or rows of the first matrix parallel to the second direction, and the second direction may be a direction perpendicular to the first direction.

A ratio of the first separation distance, the second separation distance, the third separation distance, the fourth separation distance, and the fifth separation distance to an overall length of one side of the first arrangement area parallel to the column of the first matrix may be 3.18:3.85:3.85:3.85:5.77.

A ratio of the sixth separation distance, the seventh separation distance, the eighth separation distance, and the ninth separation distance to an overall length of one side of the first arrangement area parallel to the row of the first matrix may be 3.81:5.02:5.02:6.58.

A ratio of the first separation distance, the second separation distance, the third separation distance, the fourth separation distance, and the fifth separation distance may be x1:x2:x3:x4:x5, x1 may be greater than 0.55 and less than 0.7, each of x2, x3, and x3 may be greater than 0.7 and less than 1, and x5 may be 1.

A ratio of the sixth separation distance, the seventh separation distance, the eighth separation distance, and the ninth separation distance may be y1:y2:y3:y4, y1 may be greater than 0.5 and less than 0.65, each of y2 and x3 may be greater than 0.65 and less than 1, and y4 may be 1.

A ratio of an arrangement area of the light emitting elements disposed in the plurality of arrangement areas to a surface area of a target area for curing the stage may be in a range of 1:1.08 to 1:1.37.

Still another aspect of the present invention provides a curing device including a stage on which a curing target is disposed, and a light emitting module including a substrate which is disposed on the stage and includes a plurality of arrangement areas, and light emitting elements which are alternately disposed in each of the plurality of arrangement areas, wherein the plurality of arrangement areas include first arrangement areas which are close to vertexes of the substrate and in which the light emitting elements are disposed in the form of a first matrix; second arrangement areas which are spaced apart from the vertexes of the substrate and are in contact with sides of the substrate and in which the light emitting elements are disposed in the form of a second matrix; and third arrangement areas which are spaced apart from the vertexes of the substrate and the sides of the substrate and in which the light emitting elements are disposed in the form of a third matrix, wherein a row and a column of the first matrix, which are closest to a corresponding vertex among the vertexes of the substrate, are defined as a first row and a first column, an order of rows and columns is defined as sequentially increasing in a direction away from the corresponding vertex, the rows of the first matrix are divided into a first-first group including the first row, a first-second group including a second row to a fifth row, and a first-third group including a sixth row to a last row, a first separation distance between the first-first group and the first-second group is shorter than a separation distance between the first-second group and the first-third group, the first separation distance is shorter than a separation distance between two adjacent rows included in the first-second group, and a separation distance between two adjacent rows included in the first-second group is shorter than the second separation distance.

The second separation distance may be equal to a separation distance between two adjacent rows included in the first-third group.

The columns of the first matrix may be divided into a second-first group including the first column, a second-second group including a second column and a third column, and a second-third group including a fourth column to a last column. A third separation distance between the second-first group and the second-second group may be shorter than a fourth separation distance between the second-second group and the second-third group, and the third separation distance may be shorter than a separation distance between two adjacent columns included in the second-second group.

A separation distance between two adjacent columns included in the second-third group may be equal to the fourth separation distance.

Separation distances between two adjacent rows of the second matrix may be the same as each other, and the first separation distance and the second separation distance may each be shorter than the separation distance between two adjacent rows of the second matrix.

Separation distances between two adjacent columns of the second matrix may be the same as each other, and the third separation distance and a separation distance between two adjacent columns included in the second-second group may each be shorter than the separation distance between two adjacent columns of the second matrix.

Yet another aspect of the present invention provides a curing device including a stage on which a curing target is disposed; a light emitting module including a substrate disposed on the stage and including first arrangement areas, second arrangement areas, and third arrangement areas, and light emitting elements which are alternately disposed in each of the first arrangement regions, the second arrangement regions, and the third arrangement regions; and a cooling part disposed on the light emitting module, wherein each of the first arrangement regions is close to a corresponding one among first vertexes of the substrate, the second arrangement areas are spaced apart from the first vertexes of the substrate and are in contact with sides of the substrate, the third arrangement areas are spaced from the first vertexes and the sides of the substrate, an arrangement density of the light emitting elements disposed in each of the first arrangement areas is increased as the light emitting elements are close to a corresponding one among the first vertexes, an arrangement density of the light emitting elements disposed in each of the second arrangement areas is increased as the light emitting elements are close to the sides, the cooling part includes first cooling blocks corresponding to the first arrangement areas and having second vertexes corresponding to the first vertexes, each of the first cooling blocks includes a first body, a first inlet for introducing a fluid into the first body, and a first outlet for discharging the fluid from the first body, and the first inlet is disposed to be closer to the second vertex of each of the first cooling blocks than the first outlet.

The cooling part may further include second cooling blocks corresponding to the second arrangement areas, each of the second cooling blocks may include a second body, a second inlet for introducing a fluid into the second body, and a second outlet for discharging the fluid from the second body, and the second inlets of the second cooling blocks may be disposed to be closer to sides of the second cooling blocks, which correspond to the sides of the substrate, than the second outlets.

The light emitting elements may include a first light emitting element and a second light emitting element which are alternately disposed, and the first light emitting element and the second light emitting element may emit ultraviolet light having different wavelengths.

Yet another aspect of the present invention provides a curing device including a stage on which a curing target is disposed; a light emitting module including a substrate disposed on the stage and including a plurality of arrangement areas, and light emitting elements disposed in each of the plurality of arrangement regions; a temperature sensor disposed in at least one arrangement area among the plurality of arrangement areas and configured to detect temperature information on first light emitting elements disposed in the at least one arrangement area; and a controller configured to set a slope of a drive signal for driving the first light emitting elements on the basis of the temperature information.

The controller may set a target value. Until a magnitude of the drive signal reaches the target value, the controller may vary the slope of the drive signal on the basis of the temperature information.

The controller may generate a plurality of drive signals for individually controlling driving of the light emitting elements according to the arrangement areas.

The at least one temperature sensor may include a plurality of temperature sensors. Each of the plurality of temperature sensors may be disposed in a corresponding one among the plurality of arrangement areas.

The controller may receive a plurality of pieces of temperature information provided from the plurality of temperature sensors and set a slope of a corresponding one among the plurality of drive signals on the basis of the plurality of pieces of temperature information.

The controller may decrease the slope of the drive signal on the basis of the plurality of pieces of temperature information during a first period of the drive signal, and the first period may be a period from a timing at which the light emitting elements are turned on to a timing at which a magnitude of the drive signal reaches the target value.

During the first period, the controller may non-linearly decrease the slope of the drive signal.

The drive signal may be in the form of a drive current.

The controller may maintain the magnitude of the drive signal constant at the target value during a second period, and the second period may be a period from a timing at which the magnitude of the drive signal reaches the target value to a timing at which the light emitting elements are turned off.

The temperature sensor may include two or more temperature sensors which are disposed to be spaced apart from each other in any one among the plurality of arrangement areas.

The two or more temperature sensors may include a first temperature sensor, which is disposed in a first area of at least one arrangement area, and a second temperature sensor which, is disposed in a second region of the at least one arrangement area. The first area may be an area which is adjacent to one corner of the at least one arrangement area, and the second region may be the remaining area except for the first area.

The controller may detect temperature information corresponding to the at least one arrangement area on the basis of first temperature information received from the first temperature sensor and second temperature information received from the second temperature sensor.

The controller may calculate an average value of the first temperature information and the second temperature information and set slopes of the drive signals for driving the light emitting elements disposed in the at least one arrangement area on the basis of the calculated average value.

Yet another aspect of the present invention provides a curing device including a stage on which a curing target is disposed; a light emitting module including a substrate disposed on the stage and including a plurality of arrangement areas; and first light emitting elements and second light emitting elements, which are alternately disposed in each of the plurality of arrangement areas; a temperature sensor disposed in at least one arrangement area among the plurality of arrangement areas and configured to detect temperature information on the first light emitting elements disposed in the at least one arrangement area; and a controller configured to set slopes of drive signals for driving the first light emitting elements on the basis of the temperature information, wherein the plurality of arrangement areas include first arrangement areas which are adjacent to corners of the substrate and in which the first light emitting elements and the second light emitting elements are disposed in the form of a first matrix and second arrangement areas which are spaced apart from the corners of the substrate and in which the first light emitting elements and the second light emitting elements are disposed in the form of a second matrix, a row and a column of the first matrix, which are closest to a corresponding one corner among the corners of the substrate, are defined as a first row and a first column, an order of rows and columns is defined as increasing in a direction away from the corresponding one corner, and a separation distance between two adjacent first light emitting elements and second light emitting elements, which are disposed in each of the first arrangement areas, may be reduced as the two adjacent first light emitting element and second light emitting element become closer to a corresponding one corner of the corners of the substrate.

Advantageous Effects

In accordance with the embodiments, uniformity of irradiance of a curing device can be improved.

Further, in accordance with the embodiments, it is possible to prevent degradation of uniformity of irradiance due to a temperature gradient due to an arrangement of light emitting elements.

Various beneficial advantages and effects of the present invention are not limited by the detailed description and should be easily understood through a description of a detailed embodiment of the present invention.

DESCRIPTION OF DRAWINGS

FIG. 5A is a diagram showing a simulation result of irradiance of a light emitting module in which the light emitting elements are disposed at regular intervals.

FIG. 5B is a diagram showing uniformity of the irradiance according to the simulation result of FIG. 5A.

FIG. 5D is a diagram showing uniformity of the irradiance according to the simulation result of FIG. 5C.

FIG. 7A is a diagram showing a simulation result of irradiance of the light emitting module in a case in which all of the first light emitting elements and the second light emitting elements are turned on according to a variation in separation distance of FIGS. 6A to 6C.

FIG. 7B is a diagram showing a simulation result of irradiance of the light emitting module in a case in which only the second light emitting elements are turned on according to the variation in separation distance of FIGS. 6A to 6C.

FIG. 7C is a diagram showing a simulation result of irradiance of the light emitting module in a case in which only the first light emitting elements are turned on according to the variation in separation distance of FIGS. 6A to 6C.

MODES OF THE INVENTION

Figure 1:
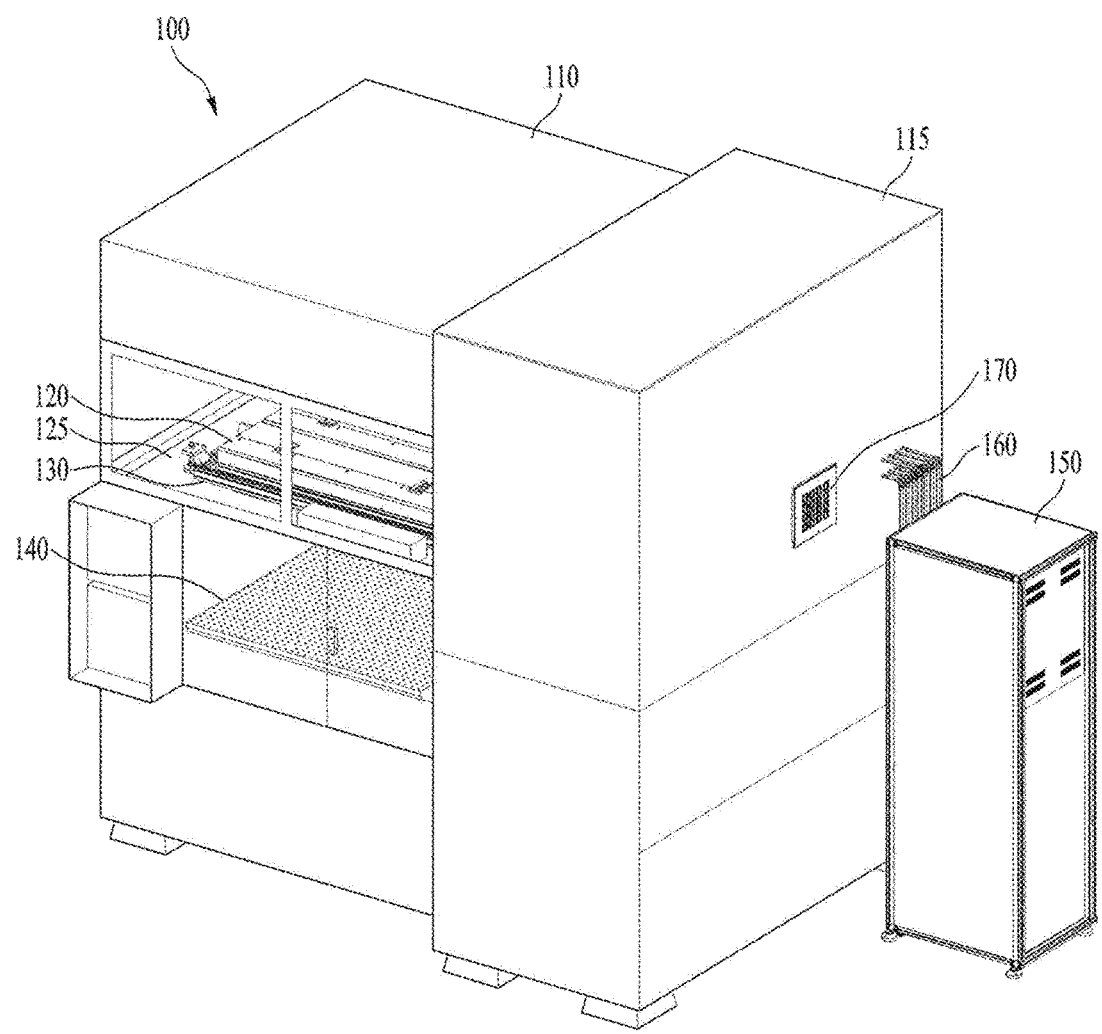
FIG. 1 is a perspective view of an ultraviolet curing device according to one embodiment.

Hereinafter, exemplary embodiments of the present invention capable of realizing the above-described objectives will be described with reference to the accompanying drawings.

In the description of the embodiments, when an element is described as being formed "on" or "under" another element, the terms "on" or "under" include the meaning of the two components being in direct contact with each other (directly) and the meaning of one or more other components being disposed and formed between the two components (indirectly). Further, when an element is described as being formed "on" or "under" another element, the description may include the meaning of the other element being formed in an upward direction of the element and formed in a downward direction from of the element.

Further, as used herein, relational terms such as "first," "second," "on/upper portion/above," and "under/lower portion/below" may be used only to distinguish one entity or element from another entity or element without necessarily requiring or implying any physical or logical relationship or an order between these entities or elements. Further, the same reference numerals denote the same components throughout the description of the drawings.

Further, the terms "comprise," "configure," or "have" specify the presence of stated components, unless there is a clearly different meaning in the present application, but do not preclude the presence thereof and should be construed to further include other components.

Figure 2:
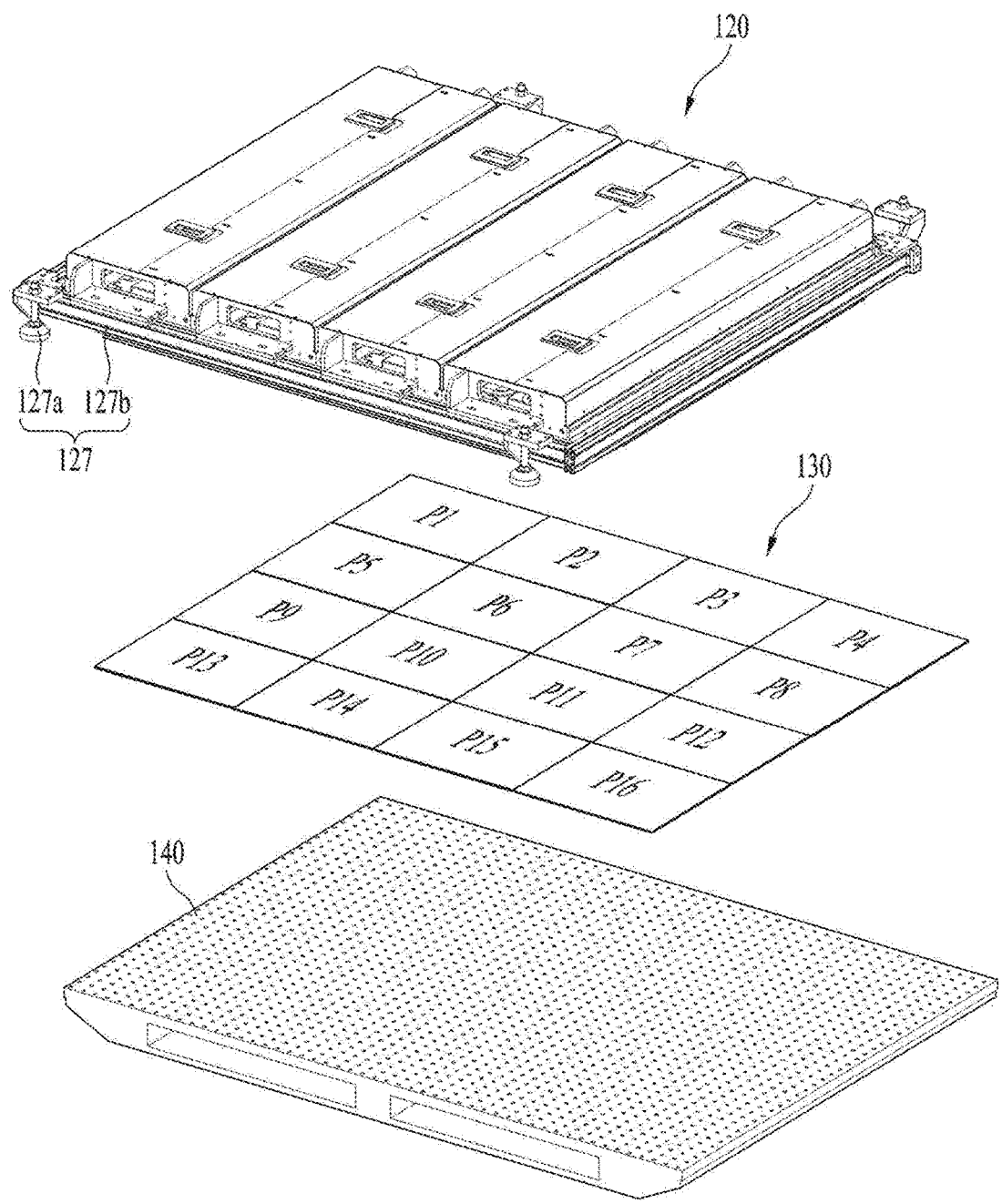
FIG. 2 is a diagram illustrating a cooling part, a light emitting module, and a stage which are shown in FIG. 1.

FIG. 1 is a perspective view of an ultraviolet curing device according to one embodiment, and FIG. 2 is a diagram illustrating a cooling part, a light emitting module, and a stage which are shown in FIG. 1.

Referring to FIGS. 1 and 2, an ultraviolet curing device 100 includes a case 110, a cooling part 120, a transparent plate 125, a support frame 127, a light emitting module 130, a stage 140, and a controller 150.

The ultraviolet curing device 100 may further include lines, which electrically connecting the controller 150 to the light emitting module 130, and a storage part 115 in which cooling water supply pipes 160 for providing cooling water to the cooling part 120 is disposed.

The case 110 may provide a space for accommodating the cooling part 120, the transparent plate 125, the light emitting module 130, and the stage 140.

For example, the case 110 may be a vacuum chamber. The case 110 may also serve to prevent ultraviolet light emitted from the light emitting module from leaking to the outside.

The transparent plate 125 may be disposed inside the case 110, and an upper surface and a lower surface of the transparent plate 125 may be disposed in parallel with an upper surface of the stage.

The transparent plate 125 may support the cooling part 120 and the light emitting module 130 and may allow light emitted from the light emitting module 130 to penetrate through the transparent plate 125.

The transparent plate 125 may be made of transparent glass or quartz, but the present invention is not limited thereto.

The transparent plate 125 may have ultraviolet transmittance in a range of 90% to 99%, but the present invention is not limited thereto.

The cooling part 120 may absorb heat generated from the light emitting module 130 to lower a temperature of the light emitting module 130. The support frame 127 may support the cooling part 120 and the light emitting module 130 and be disposed on the transparent plate 125. The cooling part 120 will be described below.

The light emitting module 130 may emit light having an ultraviolet wavelength range toward the stage 140.

The stage 140 may be an area in which a curing target is placed or disposed and may be disposed to be spaced apart from the light emitting module 130 below the transparent plate 125.

Figure 3:
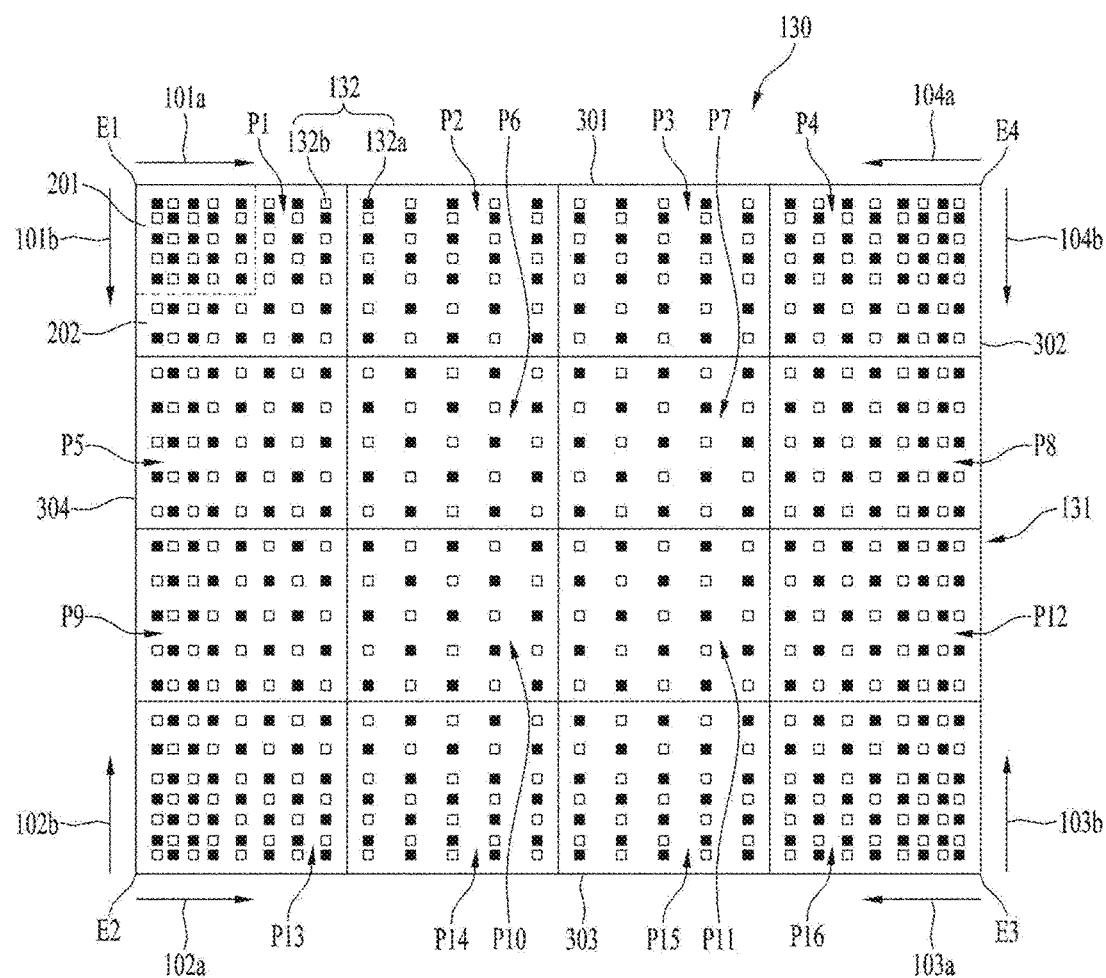
FIG. 3 is a plan view illustrating the light emitting module according to one embodiment of the present invention.

FIG. 3 is a plan view illustrating the light emitting module shown in FIG. 2.

Referring to FIG. 3, the light emitting module 130 may include a substrate 131 and a plurality of light emitting elements 132 disposed on the substrate 131.

Each of the plurality of light emitting elements 132 may be a light emitting diode (LED).

The plurality of light emitting elements 132 may include first light emitting elements 132a, each of which emit light in a first wavelength range, and second light emitting elements 132b, each of which emit light in a second wavelength range.

The first light emitting elements 132a and the second light emitting elements 132b may emit ultraviolet light having different wavelengths. For example, a wavelength of light emitted from each of the first light emitting elements 132a may be included in a wavelength range of greater than 315 nm and less than 375 nm. Further, a wavelength of light emitted from each of the second light emitting elements 132b may be included in a wavelength range of 375 nm to 420 nm.

Alternatively, each of the first light emitting elements 132a may emit light having a wavelength of 365 nm, and each of the second light emitting elements 132b may emit light having a wavelength of 385 nm.

The wavelengths of the light emitted from the first light emitting elements 132a may be the same as each other, and the wavelengths of the light emitted from the second light emitting elements 132b may be the same as each other.

Since the wavelength of the light emitted from the first light emitting element 132a is different from that of the light emitted from the second light emitting element 132b, the light emitting module 130 may implement wavelengths having a plurality of peaks. With the above configuration, a multi-wavelength may be implemented to improve a curing characteristic of an ultraviolet (UV) resin. In addition, light emitting elements, each of which emits light having a wavelength in another wavelength range, may be additionally disposed.

Each of the first and second light emitting elements 132a and 132b may be implemented as an LED chip or an LED package which emits UV light, but the present invention is not limited thereto.

The first light emitting elements 132a and the second light emitting elements 132b may each independently driven. For example, the first light emitting elements 132a may be turned on and, simultaneously, the second light emitting elements 132b may be turned off. Alternatively, the first light emitting elements 132a may be turned off and, simultaneously, the second light emitting elements 132b may be turned on. Also alternatively, the first and second light emitting elements 132a and 132b may be turned on simultaneously.

The substrate 131 may be a printed circuit board (PCB) or a metal PCB, but the present invention is not limited thereto.

As shown in FIG. 3, the substrate 131 may have a polygonal shape, e.g., a quadrangular shape. For example, one surface of the substrate 131 may include first to fourth side surfaces 301 to 304 and may include vertexes located between two adjacent side surfaces. Here, one surface of the substrate 131 may be a surface on which the light emitting elements 132 are disposed.

The substrate 131 may include a plurality of arrangement areas P1 to P16 for disposing the light emitting elements 132.

For example, the plurality of arrangement areas P1 to P16 may be disposed in the form of a matrix comprised of rows and columns, but the present invention is not limited thereto.

In FIG. 3, the substrate 131 has been illustrated as including an arrangement area which is divided into 16 areas, but the present invention is not limited thereto.

The plurality of arrangement areas P1 to P16 may correspond to a plurality of cooling blocks S1 to S16 of the cooling part 120, which will be described below.

The plurality of first light emitting elements 132a and the plurality of second light emitting elements 132b may be disposed in each of the plurality of arrangement areas P1 to P16 of the substrate 131.

The plurality of arrangement areas P1 to P16 may have the same shape, e.g., a quadrangular shape, but the present invention is not limited thereto.

The plurality of arrangement areas P1 to P16 may have the same size, e.g., the same area, but the present invention is not limited thereto.

For example, the plurality of arrangement areas P1 to P16 may have the same transverse length, and the plurality of arrangement areas P1 to P16 may have the same longitudinal length.

For example, adjacent arrangement areas among the plurality of arrangement areas P1 to P16 may be in contact with each other, but the present invention is not limited thereto. Alternatively, the plurality of arrangement areas P1 to P16 may be spaced apart from each other at regular intervals.

The plurality of arrangement areas P1 to P16 may include first arrangement areas P1, P4, P13, and P16, second arrangement areas P2, P3, P5, P8, P9, P12, P14, and P15, and third arrangement areas P6, P7, P10, and P11.

The first arrangement areas P1, P4, P13, and P16 may each include any one vertex E1, E2, E3, or E4 of the substrate 131 or may each be an area adjacent to any one vertex.

For example, the first arrangement areas P1, P4, P13, and P16 may each include any corresponding vertex E1, E2, E3, or E4 of the substrate 131 or may be adjacent to any corresponding vertex.

The second arrangement areas P2, P3, P5, P8, P9, P12, P14, and P15 may be areas which are spaced apart from the vertexes E1 to E4 of the substrate 131 and are in contact with the side surfaces 301 to 304 of the substrate 131.

The third arrangement areas P6, P7, P10, and P11 may be areas which are spaced apart from the vertexes E1 to E4 and the side surfaces 301 to 304 of the substrate 131.

For example, the first arrangement areas P1, P4, P13, and P16 and the second arrangement areas P2, P3, P5, P8, P9, P12, P14, and P15 may be disposed to surround peripheries of the third arrangement areas P6, P7, P10, and P11.

The first light emitting elements 132a and the second light emitting elements 132b may be disposed in each of the first arrangement areas P1, P4, P13, and P16 in the form of a first matrix including rows and columns.

The first light emitting elements 132a and the second light emitting elements 132b may be disposed in each of the second arrangement areas P2, P3, P5, P8, P9, P12, P14, and P15 in the form of a second matrix including rows and columns.

The first light emitting elements 132a and the second light emitting elements 132b may be disposed in each of the third arrangement areas P6, P7, P10, and P11 in the form of a third matrix including rows and columns.

For example, the first light emitting element 132a and the second light emitting element 132b may be alternately disposed in each of the first arrangement areas P1, P4, P13, and P16 in a row direction and a column direction of the first matrix.

Further, for example, the first light emitting element 132a and the second light emitting element 132b may be alternately disposed in each of the second arrangement areas P2, P3, P5, P8, P9, P12, P14, and P15 in a row direction and a column direction of the second matrix.

Further, for example, the first light emitting element 132a and the second light emitting element 132b may be alternately disposed in each of the third arrangement areas P6, P7, P10, and P11 in a row direction and a column direction of the third matrix.

The row direction of each of the first to third matrices may be a direction in which the rows of the first to third matrices are disposed, and the column direction of each of the first to third matrices may be a direction in which the columns of the first to third matrices are disposed.

For example, the row direction may be a direction from the first vertex E1 to the fourth vertex E4 among the vertexes E1 to E4 of the substrate 131, the column direction may be a direction from the first vertex E1 to the second vertex E2 of the substrate 131, and the row direction may be perpendicular to the column direction.

For example, the number of rows of the first to third matrices may be different, and the number of columns of the first to third matrices may be different, but the present invention is not limited thereto.

Alternatively, the number of rows of two matrices selected from among the first to third matrices may be the same as each other, and the number of columns of two matrices selected from among the first to third matrices may be the same as each other.

The reason why the first light emitting elements 132a and the second light emitting elements 132b are alternately disposed in the row direction and the column direction of each of the first to third matrices is to improve uniformity of light of the light emitting module 100 having a composite wavelength.

In the first arrangement areas P1, P4, P13, and P16, an arrangement of the first light emitting elements and the second light emitting elements is as follows.

An order of the rows and columns of the first matrix, which are comprised of the first light emitting elements and the second light emitting elements which are disposed in each of the first arrangement areas P1, P4, P13, and P16, may be defined as follows.

A row and a column closest to a corresponding vertex among the vertexes of the substrate 131 may be defined as a first row and a first column, and an order of columns and rows may be sequentially increased in a direction away from the corresponding vertex.

For example, a first row and a first column of the first arrangement area P1 may be a row and a column which are closest to the first vertex E1, an order of rows may be increased in a direction parallel to the row direction and away from the first vertex E1 (e.g., a direction 101a), and an order of columns may be increased in a direction parallel to the column direction and away from the first vertex E1 (e.g., a direction 101b).

Further, for example, a first row and a first column of the first arrangement area P4 may be a row and a column which are closest to the fourth vertex E4, an order of rows may be increased in a direction parallel to the row direction and away from the fourth vertex E4 (e.g., a direction 104a), and an order of columns may be increased in a direction parallel to the column direction and away from the fourth vertex E4 (e.g., a direction 104b).

As described above, a first row and a first column may be defined for each of the first arrangement areas P13 and P16, an order of rows may be increased in a direction parallel to the row direction and away from the second and third vertexes E2 and E3 (e.g., directions 102a and 103a), and an order of columns may be increased in a direction parallel to the column direction and away from the second and third vertexes E2 and E3 (e.g., a direction 102b).

Figure 4:
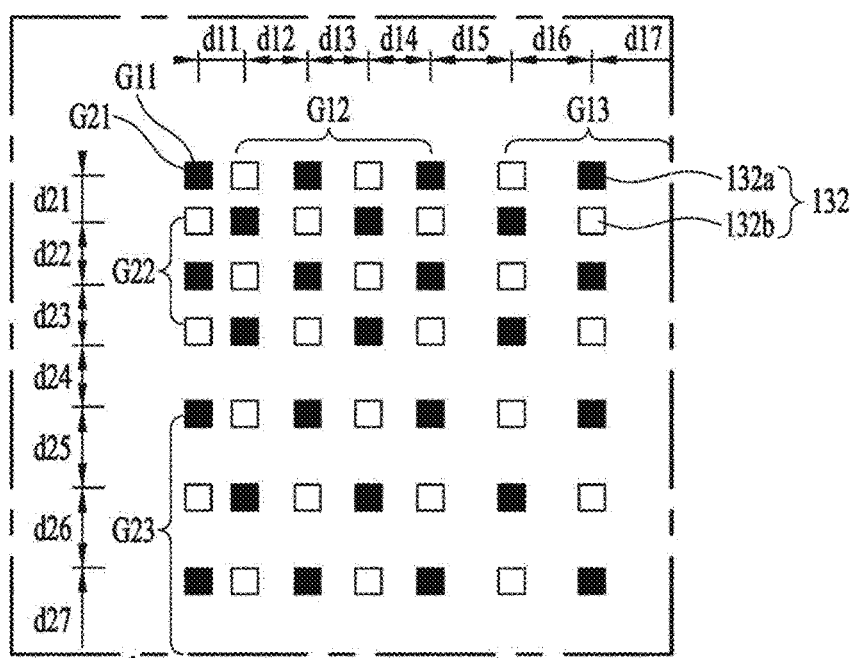
FIG. 4 is a diagram illustrating an arrangement of first light emitting elements and second light emitting elements in one area among first arrangement areas shown in FIG. 3.
Figure 4:
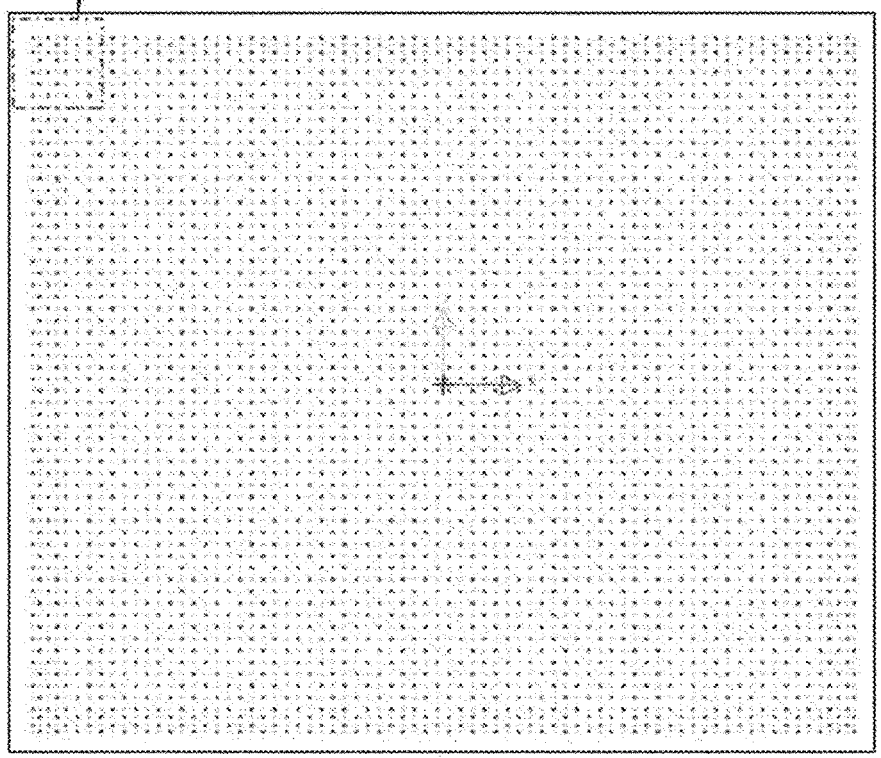

FIG. 4 is a diagram illustrating the arrangement of the first light emitting elements and the second light emitting elements in one area among the first arrangement areas shown in FIG. 3.

Referring to FIG. 4, in order to improve uniformity of irradiance of light generated from the first and second light emitting elements 132a and 132b having composite wavelengths, a separation distance between two adjacent first light emitting elements 132a and 132b, which are included in the row of the first matrix of each of the first arrangement areas P1, P4, P13, and P16, is as follows.

In an arrangement of the first and second light emitting elements 132a and 132b according to the first matrix of each of the first arrangement areas P1, P4, P13, and P16, a first separation distance d11 between a first row and a second row of the first matrix may be shorter than a second separation distance d12 between the second row and a third row (d11<d12).

Further, the second separation distance d12, a third separation distance d13 between the third row and a fourth row of the first matrix, and a fourth separation distance d14 between the fourth row and a fifth row of the first matrix may be the same as each other (d12=d13=d14).

Further, the fourth separation distance d14 may be shorter than a fifth separation distance d15 between the fifth row and a sixth row of the first matrix (d14<d15).

Each separation distance (e.g., d16, d17, . . . ) between two adjacent rows selected from among the sixth row to a last row of the first matrix may be equal to the fifth separation distance d15 (d15=d16=d17= . . . ).

Further, in order to improve the uniformity of the irradiance of the light generated from the first and second light emitting elements 132a and 132b having the composite wavelengths, a separation distance between two adjacent first light emitting elements 132a and 132b, which are included in the column of the first matrix of each of the first arrangement areas P1, P4, P13, and P16, is as follows.

A sixth separation distance d21 between a first column and a second column of the first matrix may be shorter than a seventh separation distance d22 between the second column and a third column (d21<d22).

Further, the seventh separation distance d22 may be equal to an eighth separation distance d23 between the third column and a fourth column of the first matrix (d22=d23).

The eighth separation distance d23 may be shorter than a ninth separation distance d24 between the fourth column and a fifth column of the first matrix (d23<d24).

Each separation distance (e.g., d25, d26, d27, . . . ) between two adjacent columns selected from among the fifth column to a last column of the first matrix may be equal to the ninth separation distance d24 (d24=d25=d26=d27= . . . ).

The sixth separation distance d21 between the first column and the second column of the first matrix may be less than the first separation distance d11 between the first row and the second row (d21<d11).

Further, for example, the seventh separation distance d22 between the second column and the third column of the first matrix may be less than the second separation distance d12 between the second row and the third row (d22<d12).

For example, d11:d12:d13:d14:d15:d16=x1:x2:x3:x4:x5:x6 may be satisfied, x1 may be greater than 0.55 and less than 0.7, x2, x3, and x4 may each be greater than 0.7 and less than 1, and x5 and x6 may each be 1. x2, x3, and x4 may be the same as each other, but the present invention is not limited thereto. Alternatively, x2, x3, and x4 may be different from each other.

Further, for example, d21:d22:d23:d24:d25=y1:y2:y3:y4:y5 may be satisfied, y1 may be greater than 0.5 and less than 0.65, y2 and y3 may each be greater than 0.65 and less than 1, and y4 and y5 may each be 1. y2 and y3 may be the same as each other, but the present invention is not limited thereto. Alternatively, y2 and y3 may be different from each other.

For example, d11:d12:d15=0.58:0.76:1 may be satisfied, and d21:d22:d24=0.55:0.67:1 may be satisfied.

For example, a ratio of d11, d12, and d15 to an overall length of one side surface among the first arrangement areas P1, P4, P13, and P16, which is parallel to the column of the first matrix, may be 3.18%, 3.85%, and 5.77%.

Further, for example, a ratio of d21, d22, and d24 to an overall length of one side surface among the first arrangement areas P1, P4, P13, and P16, which is parallel to the row of the first matrix, may be 3.81%, 5.02%, and 6.58%. The percentage ratio with respect to each of d11, d12, d15, d21, d22, and d24 may be a value rounded to the third decimal place.

Further, a ratio between distances in a first irregular interval section of each of the first arrangement areas P1, P4, P13, and P16 in a direction parallel to the column of the first matrix may be in a range of 16% to 17% with respect to an overall length of one side surface of each of the first arrangement areas P1, P4, P13, and P16 parallel to the column of the first matrix. For example, the first irregular interval section may be a section including separation distances, each of which is less than d15.

Further, a ratio between distances in a second irregular interval section of each of the first arrangement areas P1, P4, P13, and P16 in a direction parallel to the row of the first matrix may be in a range of 12% to 13% with respect to the overall length of one side surface of each of the first arrangement areas P1, P4, P13, and P16 parallel to the row of the first matrix. For example, the second irregular interval section may be a section including separation distances, each of which is less than d24.

The rows of the first arrangement areas P1, P4, P13, and P16 may be divided into a first-first group G11, a first-second group G12, and a first-third group G13, and the columns of the first arrangement areas P1, P4, P13, and P16 may be divided into a second-first group G21, a second-second group G22, and a second-third group G23.

For example, the first-first group G11 may include the first row of the first matrix, the first-second group G12 may include the second row to the fifth row of the first matrix, and the first-third group G13 may include the sixth row to the last row of the first matrix.

Further, for example, the second-first group G21 may include the first column of the first matrix, the second-second group G22 may include the second column and the third column of the first matrix, and the second-third group G23 may include the fourth column to the last column of the first matrix.

A separation distance between two adjacent first groups selected from among the first groups (e.g., G11, G12, G13, . . . ) may become shorter toward the vertex of the substrate 131 corresponding to the first arrangement area.

For example, the separation distance between two adjacent first groups may be a separation distance in a direction parallel to the row direction.

For example, the first separation distance d11 between the first-first group G11 and the first-second group G12 may be shorter than the fifth separation distance d15 between the first-second group G12 and the first-third group G13.

Further, the first separation distance d11 may be shorter than each of the separation distances d12, d13, and d14 between two adjacent rows included in the first-second group G12.

Further, for example, each of the separation distances d12, d13, and d14 between the two adjacent rows included in the first-second group G12 may be shorter than the fifth separation distance d15.

Further, for example, the fifth separation distance d5 may be equal to a separation distance between two adjacent rows included in the first-third group G13.

A separation distance between two adjacent second groups selected from among the second groups (e.g., G21, G22, G23, ...) may become shorter toward the vertex of the substrate corresponding to the first arrangement area. For example, the separation distance between two adjacent second groups may be a separation distance in a direction parallel to the column direction.

For example, the sixth separation distance d21 between the second-first group G21 and the second-second group G22 may be shorter than the ninth separation distance d24 between the second-second group G22 and the second-third group G23.

Further, the sixth separation distance d21 may be shorter than each of the separation distances d22 and d23 between two adjacent columns included in the second-second group G22.

Further, for example, each of the separation distances d25, d26, and d27 between two adjacent columns included in the second-third group G23 may be equal to the ninth separation distance d24.

An arrangement of the first light emitting elements and the second light emitting elements in each of the second arrangement areas P2, P3, P5, P8, P9, P12, P14, and P15 is as follows.

Separation distances between two adjacent rows of the second matrix in each of the second arrangement areas P2, P3, P14, and P15 in the first direction may be the same as each other.

Further, separation distances between two adjacent columns of the second matrix in each of the second arrangement areas P5, P8, P9, and P12 in the first direction may be the same as each other.

The first direction may be a direction parallel to one side surface of the substrate 131 adjacent to each of the second arrangement areas P2, P3, P5, P8, P9, P12, P14, and P15.

For example, the first direction with respect to the second arrangement areas P2 and P3 may be a direction parallel to the first side surface 301 of the substrate 131 adjacent to the second arrangement areas P2 and P3.

The columns or rows of the second matrix in each of the second arrangement areas adjacent to one side surface among the side surfaces 301 to 304 of the substrate 131 may correspond to or be aligned with the columns or rows of the first matrices in the first arrangement areas including vertexes adjacent to the one side surface in the first direction.

For example, the columns of the second matrix in each of the second arrangement areas P2 and P3 adjacent to the first side surface 301 may be aligned with the columns of the first matrices in the first arrangement areas P1 and P4 including the vertexes E1 and E4 adjacent to the first side surface 301 in the first direction.

Further, for example, the rows of the second matrix in each of the second arrangement areas P8 and P12 adjacent to the second side surface 302 may be aligned with the rows of the first matrices in the first arrangement areas P4 and P16 including the vertexes E3 and E4 adjacent to the second side surface 302 in the first direction.

Further, for example, an arrangement distance and the number of arrangements of the columns or rows of the second matrix parallel to the second direction may be the same as those of the columns or rows of the first matrix parallel to the second direction. The second direction may be a direction perpendicular to the first direction.

For example, a separation distance between two adjacent columns or two adjacent rows of a second matrix parallel to the second direction in each of the second arrangement areas adjacent to one side surface of the substrate 131 may be equal to a separation distance between two columns, which correspond to the two adjacent columns of the second matrix, among the columns of the first matrix in the first arrangement area including a vertex adjacent to the one side surface.

For example, a separation distance between the first column and the second column of the second matrix in each of the second arrangement areas P2 and P3 may be equal to the sixth separation distance d21 between the first column and the second column of the first matrix in the first arrangement area P1.

Further, a separation distance between the first row and the second row of the second matrix in each of the second arrangement areas P5 and P9 may be equal to the first separation distance d11 between the first row and the second row of the first matrix in the first arrangement area P1. As described above, a separation distance between two adjacent columns or rows in each of the remaining arrangement areas may also be equal to a separation distance between two adjacent columns or rows in each of corresponding first arrangement areas.

A separation distance between two adjacent rows or columns parallel to the second direction of the second matrix in each of the second arrangement areas adjacent to one side surface of the substrate 131 may be reduced toward the one side surface.

In the third arrangement areas P6, P7, P10, and P11, the first light emitting elements 132a and the second light emitting elements 132b may be disposed at regular intervals in a direction parallel to the row direction and in a direction parallel to the column direction.

For example, separation distances between two adjacent rows selected from among the rows of the third matrix may be the same as each other. Further, for example, separation distances between two adjacent columns selected from among the columns of the third matrix in a direction parallel to the column direction may be the same as each other.

An order of the rows of the second matrix in each of the second arrangement areas P2, P3, P5, P8, P9, P12, P14, and P15 and an order of the rows of the third matrix in each of the third arrangement areas P6, P7, P10, and P11 may be defined as increasing in a direction from left to right, and an order of the columns of the second matrix and an order of the columns of the third matrix may be defined as increasing in a direction from upward to downward.

A separation distance between the row of the first matrix in the first arrangement area and the row of the second matrix in the second arrangement area adjacent to the first arrangement area may be equal to a separation distance between two adjacent rows of the second matrix in the second arrangement area.

For example, a separation distance between the last row of the first matrix in the first arrangement area P1 and the first row of the second matrix in the second arrangement area P2 adjacent to the first arrangement area P1 may be equal to a separation distance between two adjacent rows of the second matrix in the second arrangement area P2.

A separation distance between the column of the first matrix in the first arrangement area and the column of the second matrix in the second arrangement area adjacent to the first arrangement area may be equal to a separation distance between two adjacent columns of the second matrix in the second arrangement area.

For example, a separation distance between the last column of the first matrix in the first arrangement area P1 and the first column of the second matrix in the second arrangement area P5 adjacent to the first arrangement area P1 may be equal to a separation distance between two adjacent columns of the second matrix in the second arrangement area P5.

A separation distance between one row and another row adjacent thereto of two adjacent second arrangement areas may be equal to a separation distance between two adjacent rows in each of the second arrangement areas.

For example, a separation distance between the last row of the second arrangement area P2 and the first row of the second arrangement area P3 may be equal to a separation distance between two adjacent rows in each of the second arrangement areas P2 and P3.

A separation distance between one column and another column adjacent thereto of two adjacent second arrangement areas may be equal to a separation distance between two adjacent columns in each of the second arrangement areas.

For example, a separation distance between the last row of the second arrangement area P5 and the first row of the second arrangement area P9 may be equal to a separation distance between two adjacent rows in each of the second arrangement areas P5 and P9.

A separation distance between the row of the second matrix in the second arrangement area and the row of the third matrix in the third arrangement area adjacent to the second arrangement area may be equal to a separation distance between two adjacent rows of the third matrix in the third arrangement area.

For example, a separation distance between the last row of the second matrix in the second arrangement area P5 and the first row in the third arrangement area P6 may be equal to a separation distance between two adjacent rows in the third arrangement area P6.

A separation distance between the column of the second matrix in the second arrangement area and the column of the third matrix in the third arrangement area adjacent to the second arrangement area may be equal to a separation distance between two adjacent columns of the third matrix in the third arrangement area.

For example, a separation distance between the last column of the second matrix in the second arrangement area P2 and the first column in the third arrangement area P6 adjacent to the second arrangement area P2 may be equal to a separation distance between two adjacent columns in the third arrangement area P6.

A separation distance between one column and another column adjacent thereto of two adjacent third arrangement areas may be equal to a separation distance between two adjacent columns in each of the third arrangement areas.

A separation distance between one row and another row adjacent thereto of two adjacent third arrangement areas may be equal to a separation distance between two adjacent rows in each of the third arrangement areas.

In FIG. 3, the substrate 131 has been illustrated as being divided into the first to third arrangement areas, but the present invention is not limited thereto.

Alternatively, the second and third arrangement areas may be omitted, and the substrate 131 may have the first arrangement areas.

Also alternatively, the second arrangement areas are omitted, and the substrate 131 may have the first and third arrangement areas.

Also alternatively, the third arrangement areas are omitted, and the substrate 131 may have the first and second arrangement areas.

As described above, in the light emitting module 130 according to the embodiment, the first and second light emitting elements 132a and 132b are densely disposed in areas adjacent to the vertexes and the side surfaces of the substrate 131, and the first and second light emitting elements 132a and 132b are disposed at regular intervals in areas away from the vertexes and the side surfaces of the substrate 131 such that it is possible to improve uniformity of irradiance in a curing area in which a curing target is disposed.

Further, as compared with the case in which the first and second light emitting elements are disposed at regular intervals on the substrate without distinguishing the first to third arrangement areas, in order to satisfy target uniformity in a curing area having a size that is equal to a size in that case, the embodiment may reduce the number of required light emitting elements, thereby reducing the area of the light emitting module.

Figure 5B:
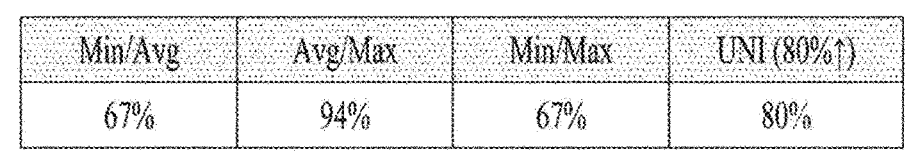
Figure 5C:
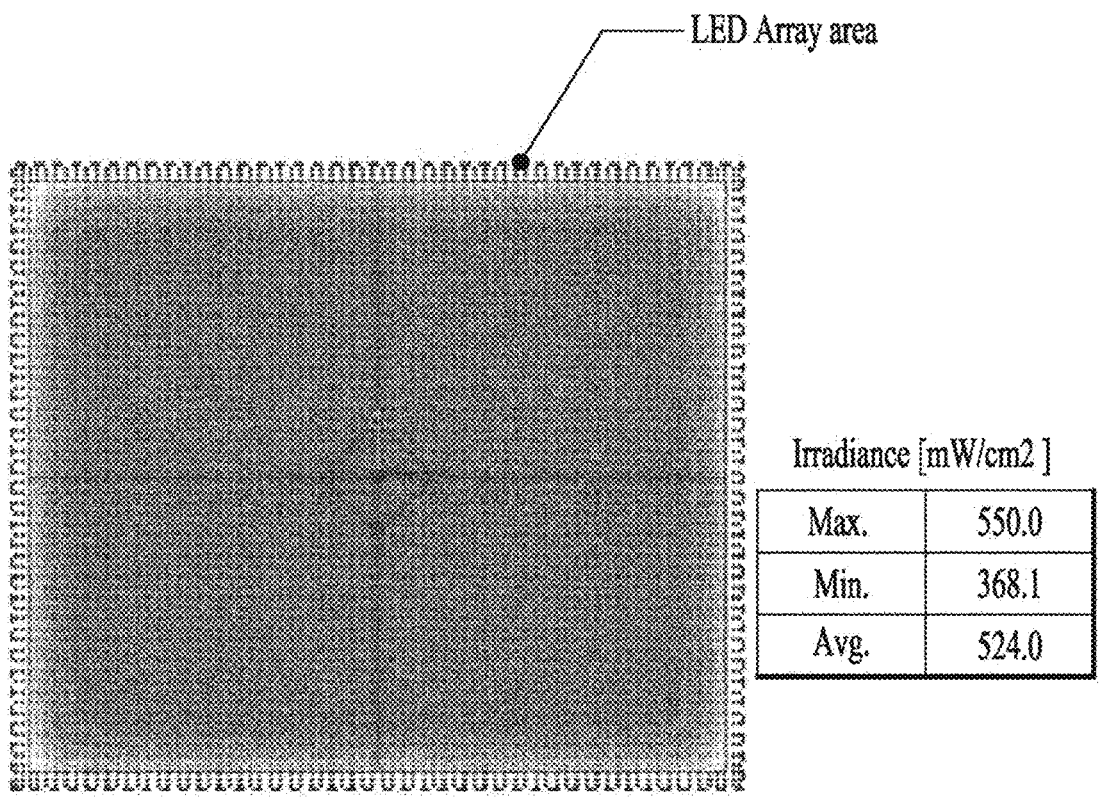
FIG. 5C is a diagram illustrating a simulation result of irradiance of the light emitting module according to the embodiment.
Figure 5D:
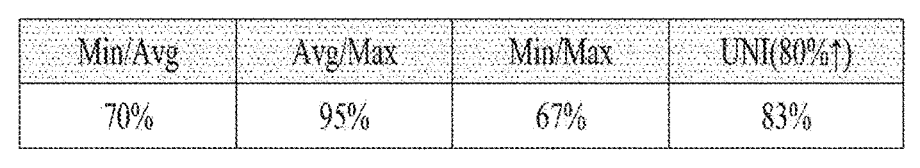

FIG. 5A is a diagram showing a simulation result of irradiance of a light emitting module in which the light emitting elements are disposed at regular intervals, FIG. 5B is a diagram showing uniformity of the irradiance according to the simulation result of FIG. 5A, FIG. 5C is a diagram illustrating a simulation result of irradiance of the light emitting module according to the embodiment, and FIG. 5D is a diagram showing uniformity of the irradiance according to the simulation result of FIG. 5C.

In FIGS. 5A and 5C, surface areas of curing areas may be equal to each other, distances between the light emitting module and the curing areas may be equal to 100 mm, and surface areas of target areas of the stage 140 for the curing areas may be the same as 1300 mm×1100 mm.

In FIG. 5C, an arrangement of the first light emitting elements and the second light emitting elements may be disposed according to the ratio as described in FIG. 4.

For example, $d11:d12:d13:d14:d15:d16=0.58:0.76:0.76:0.76:1:1$ may be satisfied.

For example, $d21:d22:d23:d24:d25=0.55:0.67:0.67:1:1$ may be satisfied.

In FIG. 5A, the first light emitting elements and the second light emitting elements may be disposed in the form of a matrix of 68×80, and an array area of the light emitting elements (LED array area) may be 1500 mm×1307 mm. Here, a surface area of the LED array area may be a surface area of one area of the substrate 131 on which the first and second light emitting elements 132a and 132b are disposed.

In FIG. 5A, a transverse length of the LED array area is greater than a longitudinal length thereof, but the present invention is not limited thereto.

Alternatively, the transverse length of the LED array area may be equal to the longitudinal length thereof. In this case, a ratio with respect to an arrangement of the first and second light emitting elements adjacent to each other in the row direction in each of the first arrangement areas P1, P4, P13, and P16 may be equal to a ratio with respect to an arrangement of the first and second light emitting elements adjacent to each other in the column direction in each of the first arrangement areas P1, P4, P13, and P16.

In another embodiment in which the transverse length and the longitudinal length of the LED array area are the same as each other, the description of the ratio of d11 to d16 may be equally applied to both of the row direction and the column direction. For example, the arrangement of the first and second light emitting elements in the row direction and the column direction may satisfy the ratio of d11:d12:d13:d14:d15:d16=x1:x2:x3:x4:x5:x6, x1 may be greater than 0.55 and less than 0.7, x2, x3, and x4 may each be greater than 0.7 and less than 1, and x5 and x6 may each be 1. x2, x3, and x4 may be the same as each other, but the present invention is not limited thereto. Alternatively, x2, x3, and x4 may be different from each other.

For example, when the transverse length and the longitudinal length of the LED array area are the same as each other, the arrangement of the first and second light emitting elements in the row direction and the column direction of the first arrangement areas P1, P4, P13, and P16 may satisfy the ratio of d11:d12:d13:d14:d15:d16=0.58:0.76:0.76:0.76:1:1.

Also, alternatively, the description of the ratio of d21 to d25 may be equally applied to both of the row direction and the column direction.

For example, in still another embodiment in which the transverse length and the longitudinal length of the LED array area are the same as each other, the arrangement of the first and second light emitting elements in the row direction and the column direction may be d21:d22:d23:d24:d25=y1:y2:y3:y4:y5.

y1 may be greater than 0.5 and less than 0.65, y2 and y3 may each be greater than 0.65 and less than 1, and y4 and y5 may each be 1. y2 and y3 may be the same as each other, but the present invention is not limited thereto. Alternatively, y2 and y3 may be different from each other.

For example, when the transverse length and the longitudinal length of the LED array area are the same as each other, the arrangement of the first and second light emitting elements in the row direction and the column direction of the first arrangement areas P1, P4, P13, and P16 may satisfy the ratio of d21:d22:d23:d24:d25=0.55:0.67:0.67:1:1.

Meanwhile, in FIG. 5C, the first light emitting elements and the second light emitting elements may be disposed in the form of a matrix of 62×74, and an LED array area may be 1344 mm×1146 mm.

"Max" denotes a maximum value of irradiance, "Min" denotes a minimum value of the irradiance, "Avg" denotes an average value of the irradiance, and "UNI" is defined as 1−{(Max−Min)/(2Avg)}.

Referring to FIGS. 5C and 5D, uniformity of irradiance in FIG. 5C may be improved as compared with that in FIG. 5A. Therefore, according to the present embodiment, the uniformity may be improved as compared with that in FIG. 5A. Further, according to the present embodiment, when compared with the number of light emitting elements in FIG. 5A, the number of light emitting elements of the light emitting module for satisfying such uniformity improvement may be reduced by 16%, and the LED array area may be reduced about 20%.

An area ratio S1:S2 of a surface area S1 of the target area to a surface area S2 of the LED array area according to the present embodiment may be in a range of 1:1.08 to 1:1.37.

Even though the surface area of the target area is varied, the surface area of the LED array area may be freely set according to the above-described area ratio. Consequently, according to the present embodiment, the surface area of the LED array area may be reduced and, simultaneously, uniformity of irradiance may be secured.

Figure 6A:
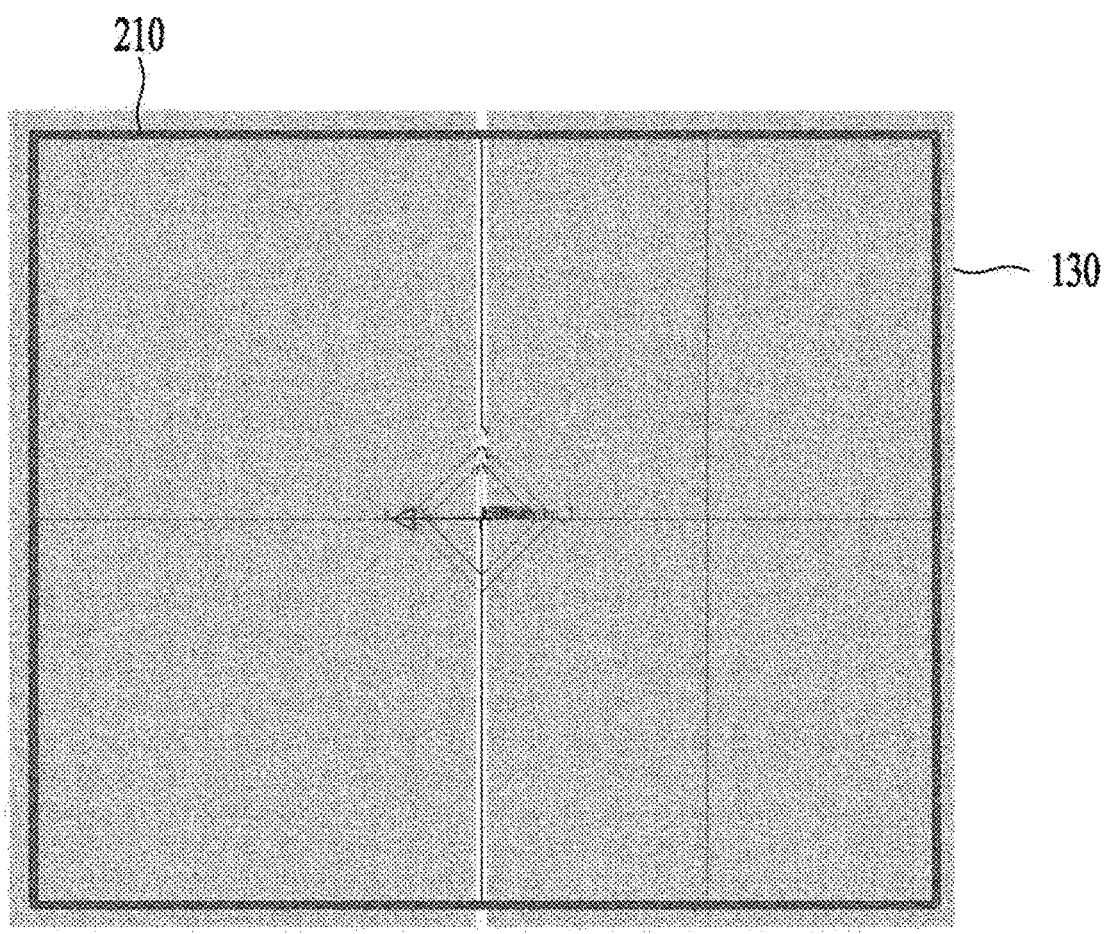
FIG. 6A is a diagram illustrating a size of an irradiance meter for an irradiance measurement simulation of the light emitting module shown in FIG. 4.
Figure 6B:
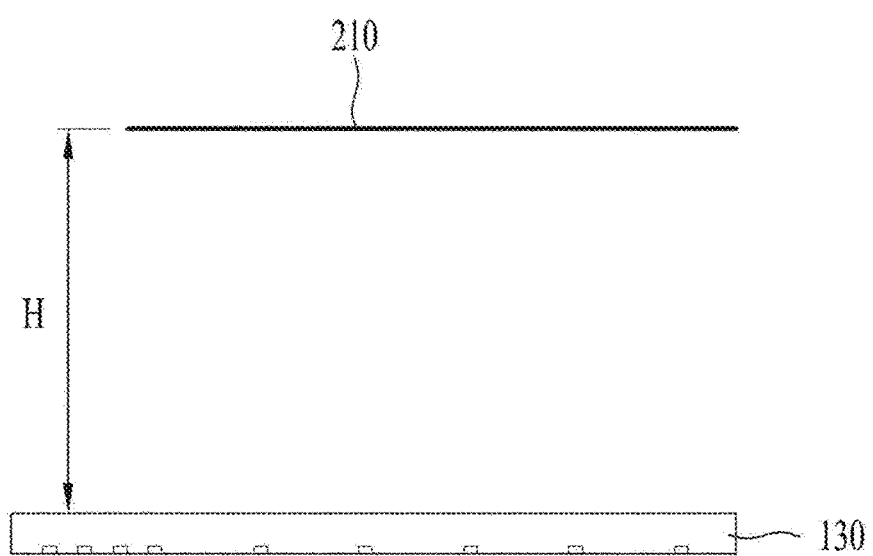
FIG. 6B is a diagram illustrating a separation distance between the light emitting module and the irradiance meter for an irradiance measurement simulation of the light emitting module shown in FIG. 4.
Figure 6C:
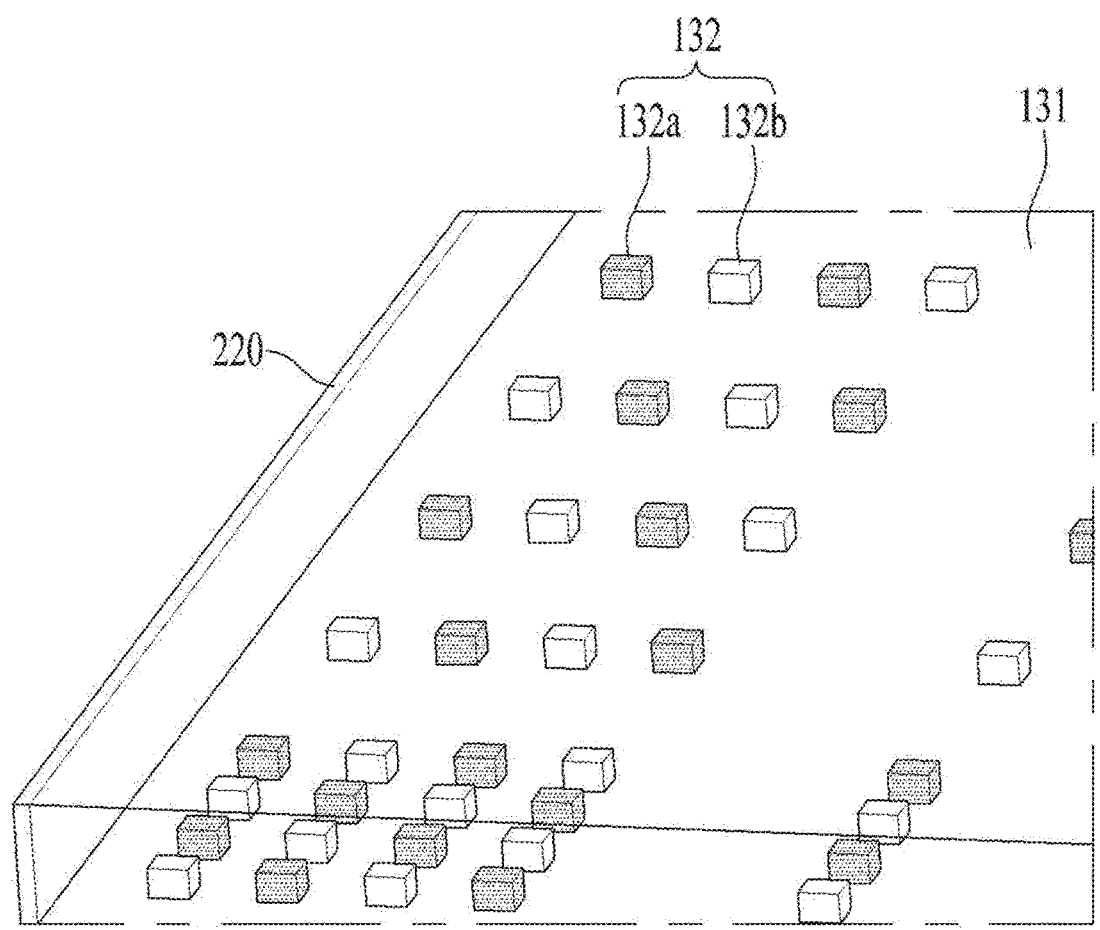
FIG. 6C is a diagram illustrating reflectance of a substrate for the irradiance measurement simulation of the light emitting module shown in FIG. 4.

FIG. 6A is a diagram illustrating a size of an irradiance meter for an irradiance measurement simulation of the light emitting module shown in FIG. 4, FIG. 6B is a diagram illustrating a separation distance between the light emitting module and the irradiance meter for an irradiance measurement simulation of the light emitting module shown in FIG. 4, and FIG. 6C is a diagram illustrating reflectance of a substrate for the irradiance measurement simulation of the light emitting module shown in FIG. 4.

In FIG. 4, power of the first light emitting element 132a may be 1.90 W, power of the second light emitting element 132b may be 2.19 W, d11 may be 11 mm, each of d12, d13, and d14 may be 14.50 mm, d15 may be 19 mm, d21 may be 10.75 mm, each of d22 and d23 may be 13 mm, and d24 may be 19.50 mm.

Referring to FIG. 6A, a transverse length of a light emitting element array including the first and second light emitting elements disposed on the substrate 131 of the light emitting module 130 may be 1355.75 mm and a longitudinal length thereof may be 1155.50. A transverse length of an irradiance meter 210 may be 1300 mm and a longitudinal length thereof may be 1100 mm.

Referring to FIG. 6B, irradiance may be measured by varying a distance H from the first and second light emitting elements 132a and 132b of the light emitting module 130 to a sensing part of the irradiance meter 210 in a range of 50 mm to 100 mm by 10 mm.

Referring to FIG. 6C, reflectance of one surface of the substrate 131 on which the first and second light emitting elements 132a and 132b are disposed may be 70%. A reflective sidewall 220 may be provided to protrude from one surface of the substrate 131 to surround peripheries of the first and second light emitting elements 132a and 132b. Reflectance of the reflective sidewall 220 may be 70%.

FIGS. 7A to 7C are diagrams showing the irradiance simulation results of the first and second light emitting elements shown in FIGS. 6A to 6C. In FIG. 7A, an average value of target irradiance of the light emitting module according to the embodiment may be 500 mW/cm2, and uniformity UNI of the target irradiance may be 80% or 90%.

FIG. 7A is a diagram showing a simulation result of irradiance of the light emitting module in a case in which all of the first light emitting elements and the second light emitting elements are turned on according to a variation in separation distance H of FIGS. 6A to 6C.

FIG. 7B is a diagram showing a simulation result of irradiance of the light emitting module in a case in which only the second light emitting elements are turned on according to the variation in separation distance H of FIGS. 6A to 6C.

FIG. 7C is a diagram showing a simulation result of irradiance of the light emitting module in a case in which only the first light emitting elements are turned on according to the variation in separation distance H of FIGS. 6A to 6C.

In a case of each of FIGS. 7A, 7B, and 7C, it can be seen that, when the separation distance H is in a range of 50 mm to 100 mm, the uniformity UNI of the irradiance satisfies 80% or more.

Further, in the case of each of FIGS. 7A, 7B, and 7C, it can be seen that, when the separation distance H is in a range of 50 mm to 70 mm, the uniformity UNI of the irradiance satisfies 90% or more.

Further, in the case of each of FIGS. 7A, 7B, and 7C, it can be seen that, when the separation distance H is 50 mm, the uniformity UNI of the irradiance satisfies 95% or more.

Further, in the case of each of FIGS. 7A, 7B, and 7C, it can be seen that, when the separation distance H is in a range of 50 mm to 100 mm, the uniformity Avg/Max of the irradiance satisfies 95% or more.

Further, in FIG. 7A, it can be seen that the average value Avg of the irradiance of the light emitting module 130 according to the embodiment is 500 mW/cm2 or more.

Figure 8:
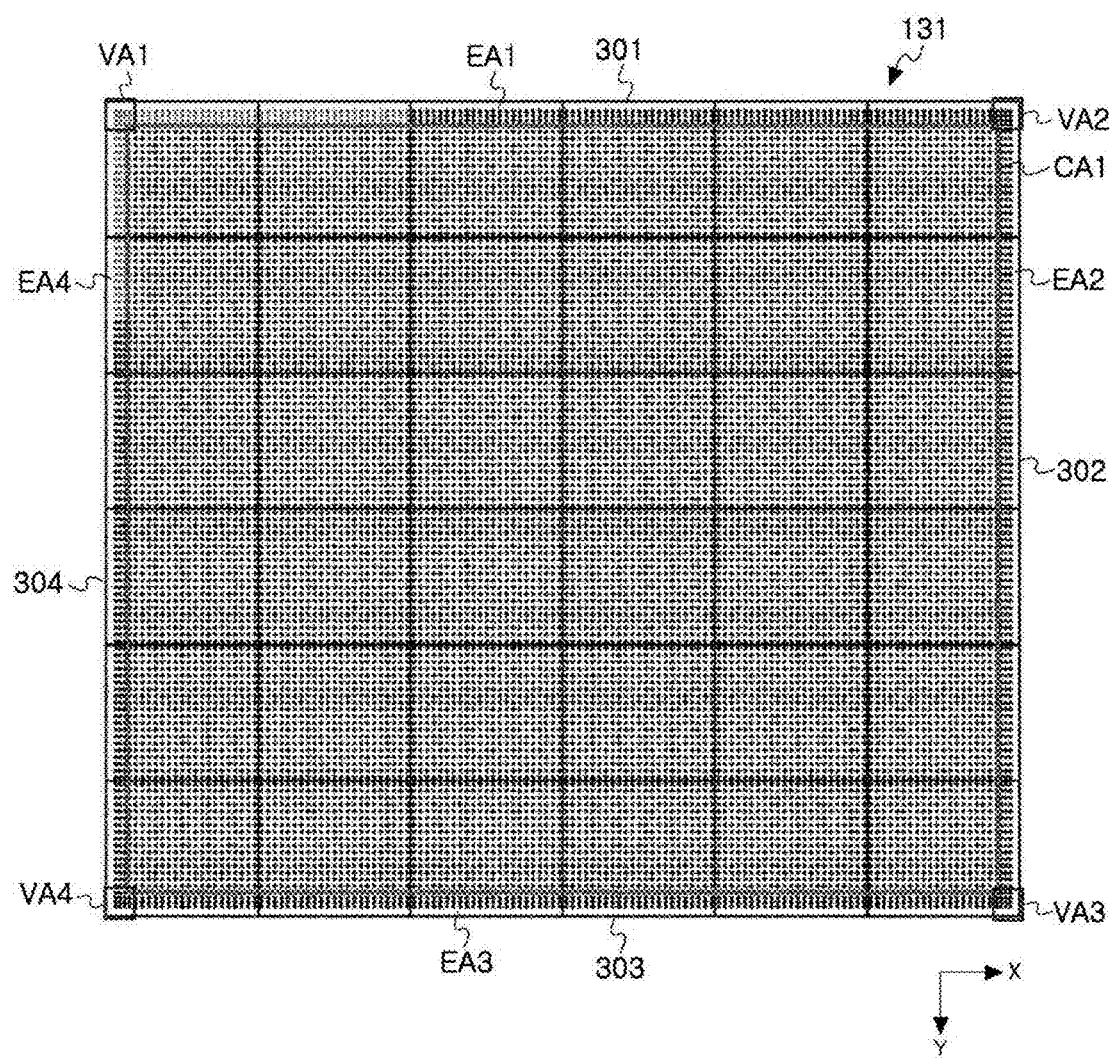
FIG. 8 is a plan view of a light emitting module according to another embodiment of the present invention.
Figure 9:
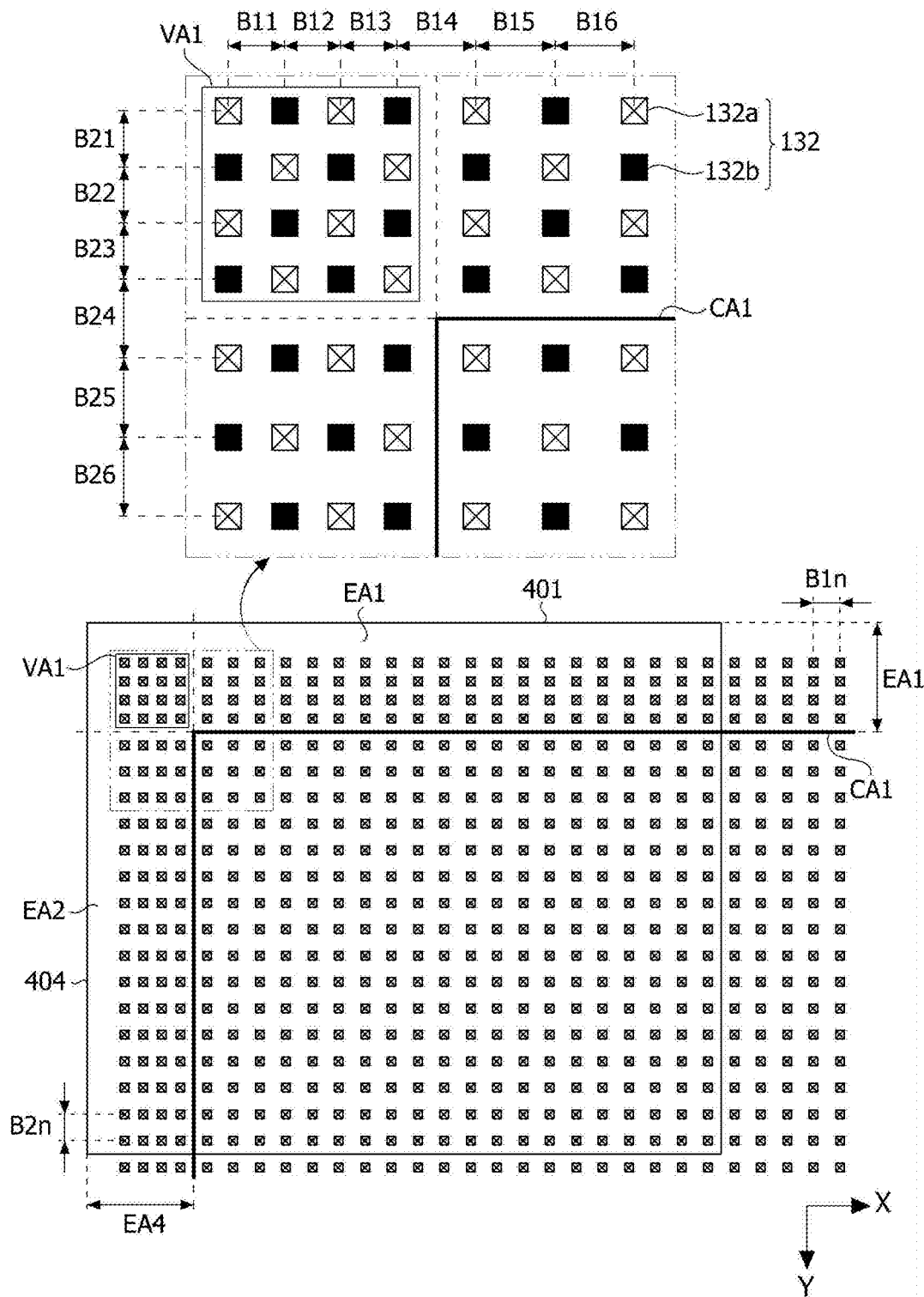
FIG. 9 is an enlarged diagram of a portion of FIG. 8.

FIG. 8 is a plan view of a light emitting module according to another embodiment of the present invention, and FIG. 9 is an enlarged diagram of a portion of FIG. 8.

Referring to FIGS. 8 and 9, a substrate 131 of the light emitting module may include a central area CA1 in which a plurality of light emitting elements 132 are disposed, and edge areas EA1, EA2, EA3, and EA4 which surround the central area CA1.

The central area CA1 may occupy 85% to 98% of an overall area of the substrate 131. The substrate 131 may include a first side surface 301 and a third side surface 303 which are opposite to each other, and a second side surface 302 and a fourth side surface 304 which are opposite to each other.

In the plurality of light emitting elements 132 disposed in the central area CA1, intervals B25 and B26 in a second direction (Y-axis direction) may be greater than intervals B15 or B16 in a first direction (X-axis direction). However, the present invention is not limited thereto, and the intervals B25 and B26 in the second direction may be equal to the intervals B15 and B16 in the first direction. For example, in the plurality of light emitting elements 132 disposed in the central area CA1, the intervals B25 and B26 in the second direction may each be 19.5 mm, and the intervals B15 and B16 in the first direction may each be 19.0 mm.

Hereinafter, the first direction (X-axis direction) is defined as a transverse direction and the second direction (Y-axis direction) is defined as a longitudinal direction based on the drawing.

The edge areas EA1, EA2, EA3 and EA4 may include a first edge area EA1 disposed to be close to the first side surface 301 of the substrate 131, a second edge area EA2 disposed to be close to the second side surface 302 of the substrate 131, a third edge area EA3 disposed to be close to the third side surface 303 of the substrate 131, and a fourth edge area EA4 disposed to be close to the fourth side surface 304 of the substrate 131.

The first edge area EA1 and the third edge area EA3 may extend in the transverse direction, and the second edge area EA2 and the fourth edge area EA4 may extend in the longitudinal direction.

Widths of the first edge area EA1 and the third edge area EA3 in the longitudinal direction may be the same as each other, and widths of the second edge area EA2 and the fourth edge area EA4 in the transverse direction may be the same as each other.

For example, four-column light emitting elements 132 may be continuously disposed in the transverse direction in each of the first edge area EA1 and the third edge area EA3, and four-row light emitting elements 132 may be continuously disposed in the longitudinal direction in each of the second edge area EA2 and the fourth edge area EA4. However, the number of the light emitting elements 132 may be appropriately adjusted according to dimensions of the substrate 131. For example, five-column light emitting elements 132 may be disposed in the transverse direction in each of the first edge area EA1 and the third edge area EA3, and five-row light emitting elements 132 may be disposed in the longitudinal direction in each of the second edge area EA2 and the fourth edge area EA4.

An interval between the light emitting elements 132 disposed in each of the first to fourth edge areas EA1, EA2, EA3, and EA4 may be less than an interval between the light emitting elements 132 disposed in the central area CA1. With the above configuration, it is possible to prevent degradation of uniformity of irradiance in each of the edge areas EA1, EA2, EA3, and EA4. That is, since irradiance is low at an edge because a superimposed quantity of light is relatively small, the light emitting element 132 may be further disposed such that the irradiance may be generally adjusted.

For example, the intervals B21, B22, and B23 of the light emitting elements 132 disposed in each of the first edge area EA1 and the third edge area EA3 in the longitudinal direction may be narrower than the intervals B24, B25, and B26 of the light emitting elements 132 disposed in the central area CA1 in the longitudinal direction.

Further, the intervals B11, B12, and B13 of the light emitting elements 132 disposed in each of the second edge area EA2 and the fourth edge area EA4 in the transverse direction may be narrower than the intervals B15 and B16 of the light emitting elements 132 disposed in the central area CA1 in the transverse direction.

For example, the intervals B21, B22, and B23 of the light emitting elements 132 disposed in each of the first edge area EA1 and the third edge area EA3 in the longitudinal direction may each be 13.5 mm, and the intervals B11, B12, and B13 of the light emitting elements 132 disposed in each of the second edge area EA2 and the fourth edge area EA4 in the transverse direction may each be 13.5 mm. However, such an interval may be appropriately adjusted according to the dimensions of the substrate 131.

The edge areas EA1, EA2, EA3, and EA4 may include a first corner area VA1 in which the first edge area EA1 intersects the fourth edge area EA4, a second corner area VA2 in which the first edge area EA1 intersects the second edge area EA2, a third corner area VA3 in which the third edge region EA3 intersects the second edge area EA2, and a fourth corner area VA4 in which the third edge area EA3 intersects the fourth edge area EA4.

The number of the light emitting elements 132 per unit area in each of the first to fourth corner areas VA1, VA2, VA3, and VA4 may be larger than the number of the light emitting elements 132 per unit area in each of the remaining areas. That is, the light emitting elements 132 may be disposed most densely in the first to fourth corner areas VA1, VA2, VA3, and VA4.

With the above configuration, it is possible to compensate for low irradiance at the corners of the substrate 131 to improve uniformity of irradiance. For example, the intervals of the light emitting elements 132 in each of the first to fourth edge areas VA1, VA2, VA3, and VA4 in the transverse direction and the longitudinal direction may each be 13.5 mm. However, these intervals may be appropriately adjusted according to the dimensions of the substrate 131.

The plurality of light emitting elements 132, which are disposed in the central area CA1 and the edge areas EA1, EA2, EA3, and EA4 of the substrate 131, may include a plurality of first light emitting elements 132a and a plurality of second light emitting elements 132b. The plurality of first light emitting elements 132a and the plurality of second light emitting elements 132b may be alternately disposed, but the present invention is not limited thereto. As described in FIG. 3, the plurality of first light emitting elements 132a and the plurality of second light emitting elements 132b may output light having different UV wavelength ranges. Accordingly, like a UV lamp, since multiple wavelengths may be implemented, curing performance may be improved.

Figure 10:
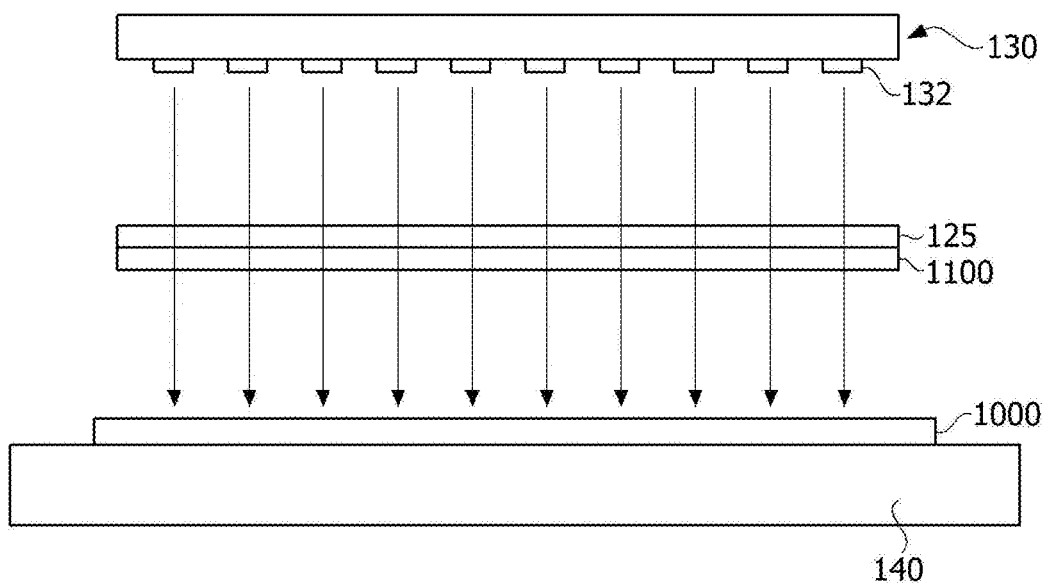
FIG. 10 is a conceptual diagram of a curing device according to one embodiment of the present invention.
Figure 11:
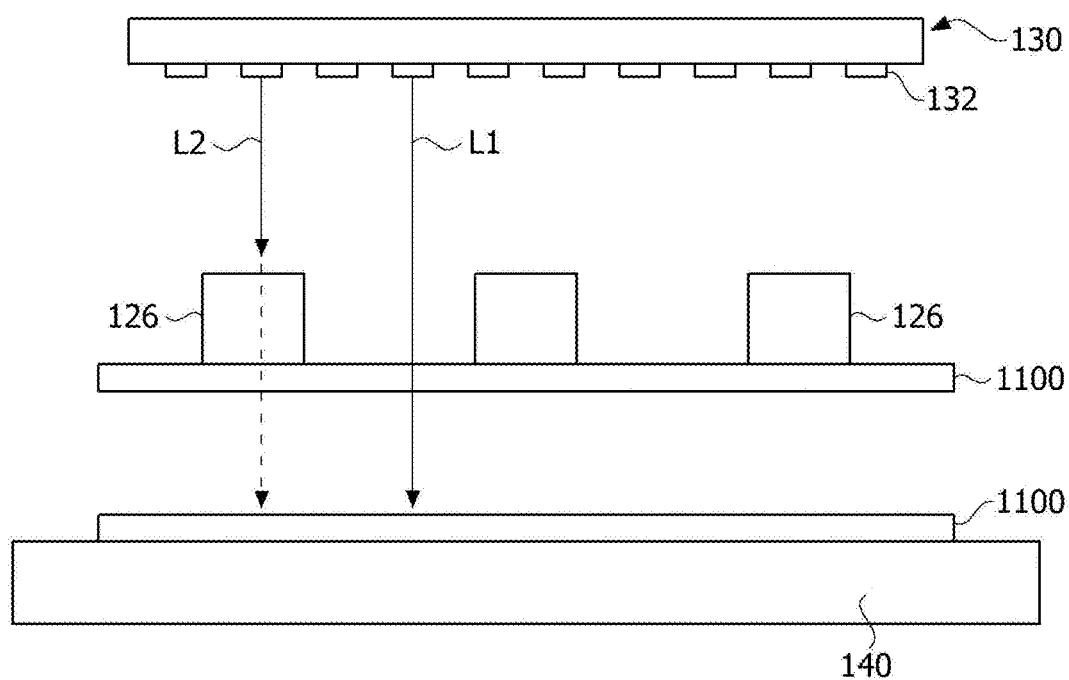
FIG. 11 is a conceptual diagram of a curing device according to another embodiment of the present invention.
Figure 12:
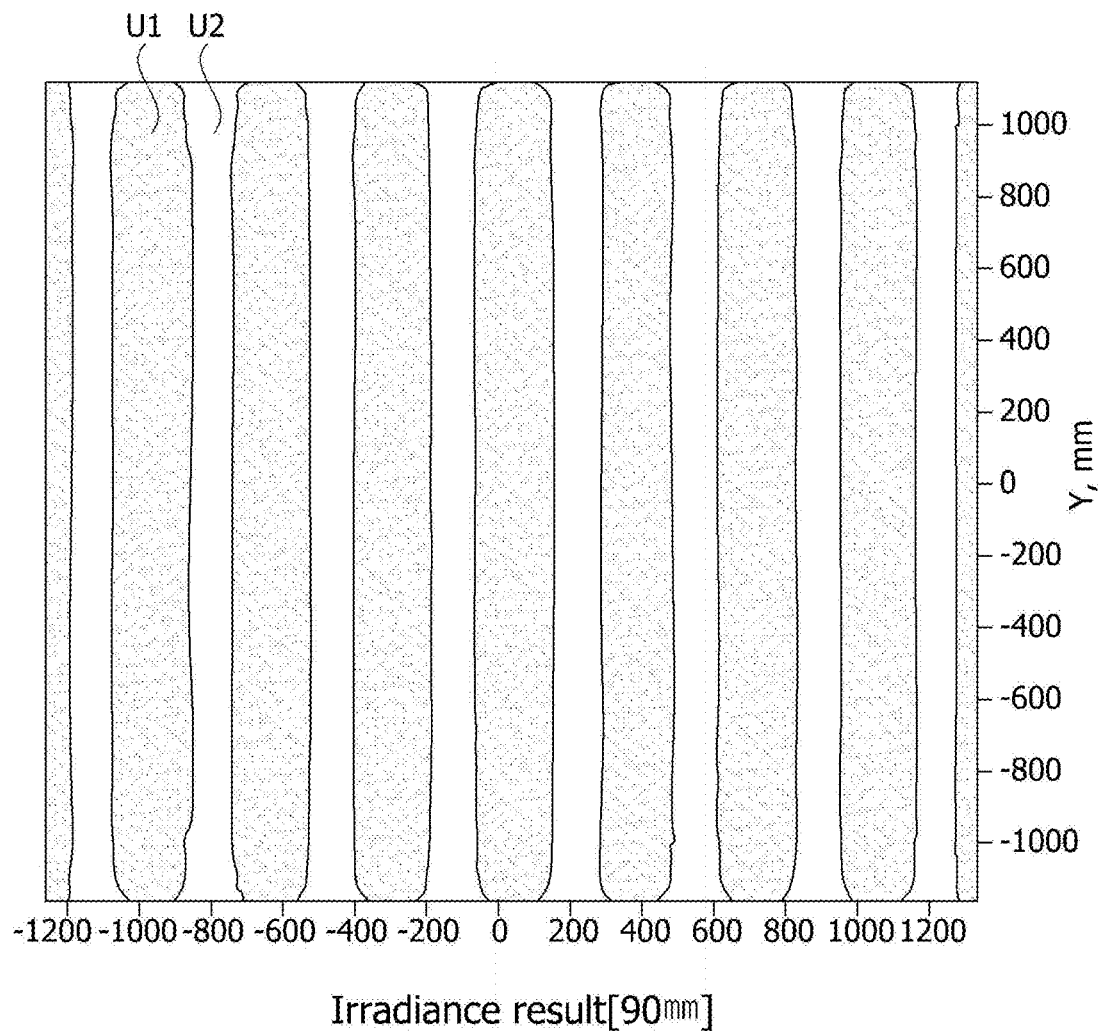
FIG. 12 is a result of measuring uniformity of light emitted from the curing device of FIG. 11.

FIG. 10 is a conceptual diagram of a curing device according to one embodiment of the present invention, FIG. 11 is a conceptual diagram of a curing device according to another embodiment of the present invention, and FIG. 12 is a result of measuring uniformity of light emitted from the curing device of FIG. 11.

Referring to FIG. 10, in the curing device according to one embodiment, a transparent plate 125 may fix a mask pattern 1100. Specifically, a suction channel (not shown) may be formed in the transparent plate 125. When air is suctioned through the suction channel, the transparent plate 125 may fix the mask pattern 1100.

Accordingly, all light emitted from the plurality of light emitting elements 132 disposed in the light emitting module 130 may be selectively irradiated according to the mask pattern 1100 to cure a curing target 1000. The curing target 1000 disposed on a stage 140 may be a UV resin layer applied onto glass, but the present invention is not limited thereto.

Most of the light emitted from the plurality of light emitting elements 132 penetrates through the transparent plate 125. Accordingly, some light loss may occur, but irradiance is reduced overall such that relatively uniform irradiance may be achieved.

However, as shown in FIG. 11, in the case of a large area curing device, a mask pattern 1100 may be suctioned using transparent blocks 126 instead of the transparent plate 125. In the case of a large area display, as a curing target 1000 is increased, the mask pattern 1100 should be increased. Therefore, the transparent plate 125 for fixing the curing target 1000 should also be increased. In this case, it may be effective to use the transparent block 126 instead of increasing the transparent plate 125 in many ways. For example, when the transparent blocks 126 are disposed at predetermined intervals to fix the mask pattern 1100, a manufacturing cost may be reduced.

The transparent block 126 may be made of transparent glass or quartz, but the present invention is not limited thereto. The transparent block 126 may have ultraviolet transmittance in a range of 90% to 99%, but the present invention is not limited thereto.

However, when the transparent block 126 is used, a part L2 of light emitted from a plurality of light emitting elements 132 penetrates through the transparent block 126 such that light loss occurs, whereas a part L1 of the light does not penetrate through the transparent block 126 such that light loss does not occur. Therefore, there may occur a problem in that uniformity of irradiance is degraded.

Referring to FIG. 12, it can be seen that the irradiance of an area U2 in which light penetrates through the transparent block 126 and an area U1 in which the light penetrates therethrough is not uniform.

Figure 13:
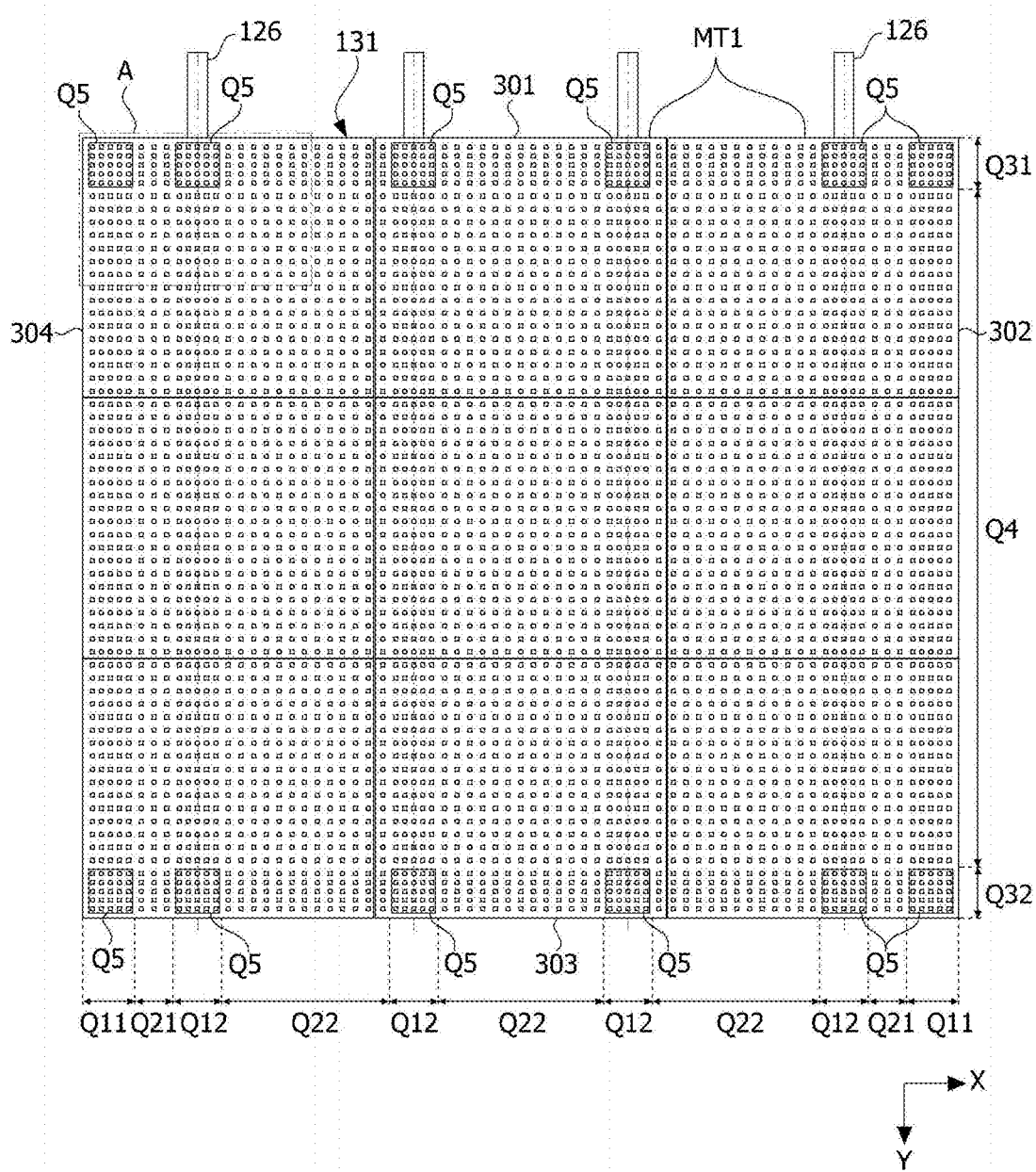
FIG. 13 is a plan view of a light emitting module according to still another embodiment of the present invention.
Figure 14:
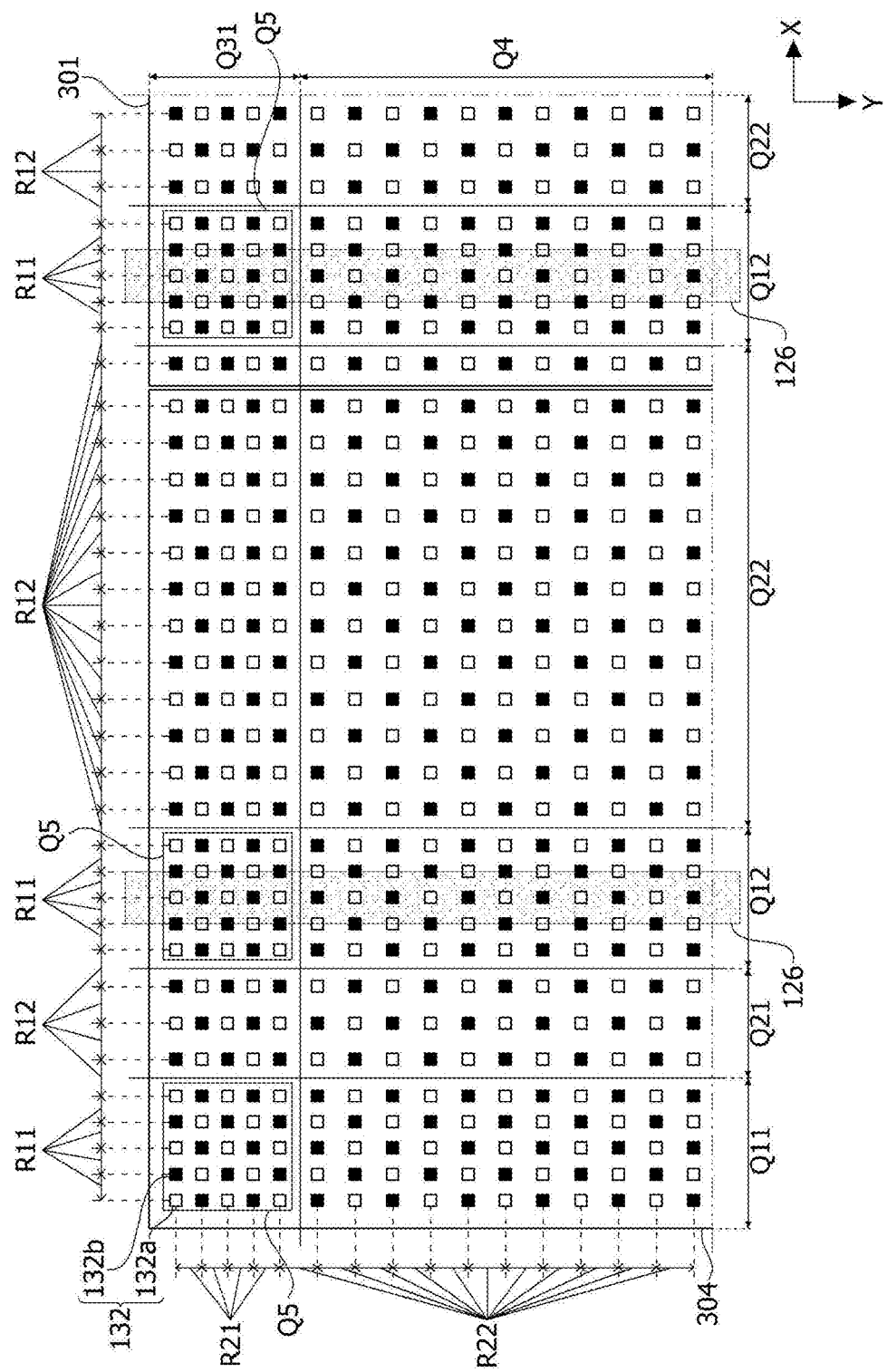
FIG. 14 is an enlarged diagram of a portion of FIG. 13.

FIG. 13 is a plan view of a light emitting module according to still another embodiment of the present invention, and FIG. 14 is an enlarged diagram of a portion of FIG. 13.

Referring to FIG. 13, a substrate 131 may include a plurality of arrangement areas MT1 for disposing light emitting elements 132. For example, the plurality of arrangement areas MT1 may be disposed in the form of a matrix comprised of rows and columns, but the present invention is not limited thereto.

In FIG. 13, the substrate 131 has been illustrated as including the nine divided arrangement areas MT1, but the present invention is not limited thereto. For example, the substrate 131 may include thirty-six divided arrangement areas MT1.

A size of each of the arrangement areas MT1 in a first direction (X-axis direction) may be 436 mm, and a size thereof in a second direction (Y-axis direction) may be 389 mm. Accordingly, the substrate 131 may include nine or thirty-six arrangement areas, each having dimensions of 436 mm in transverse and 389 mm in longitudinal. That is, as the dimensions of the substrate 131 increase, the number of arrangement areas may increase. In this case, a surface area of each of the arrangement areas MT1 may be adjusted as necessary.

The arrangement areas of the substrate 131 may correspond to sizes of a plurality of cooling blocks of a cooling part which will be described below. Further, the arrangement areas MT1 of the substrate 131 may be equal to an area of a plurality of circuit boards.

Referring to FIGS. 13 and 14, a plurality of first light emitting elements 132a and a plurality of second light emitting elements 132b may be disposed on the substrate 13. The plurality of first light emitting elements 132a and the plurality of second light emitting elements 132b may be alternately disposed, but the present invention is not limited thereto. As described in FIG. 3, the plurality of first light emitting elements 132a and the plurality of second light emitting elements 132b may output light having different UV wavelength ranges. Accordingly, like a UV lamp, since multiple wavelengths may be implemented, curing performance may be improved.

The substrate 131 may include a plurality of first sections Q11 and Q12 and a plurality of second sections Q21 and Q22, which are disposed to be spaced in the first direction (X axis direction) and to extend in the second direction (Y axis direction). The plurality of first sections Q11 and Q12 and the plurality of second sections Q21 and Q22 may be alternately disposed in the first direction (X axis direction).

Hereinafter, the first direction (X-axis direction) is defined as a transverse direction and the second direction (Y-axis direction) is defined as a longitudinal direction.

The plurality of first sections Q11 and Q12 may include a first sub-section Q11 including an edge area of the substrate 131, and a second sub-section Q12 in which a plurality of transparent blocks 126 are disposed.

Accordingly, a sub-section disposed at a leftmost position among the plurality of first sub-sections Q11 may include a fourth side surface 304 of the substrate 131, and a sub-section disposed at a rightmost position among the plurality of first sub-sections Q11 may include a second side surface 302 of the substrate 131.

The plurality of transparent blocks 126 may be disposed in the second sub-sections Q12. The plurality of transparent blocks 126 may be disposed to be spaced apart in the transverse direction and to extend in the longitudinal direction. In this case, separation distances between the plurality of transparent blocks 126 in the transverse may be the same as each other, but the present invention is not limited thereto.

Intervals R11 of the light emitting elements 132 disposed in the first sections Q11 and Q12 in the transverse direction may be narrower than intervals R12 of the light emitting elements 132 disposed in the second sections Q21 and Q22 in the transverse direction. That is, according to the present embodiment, the light emitting elements 132 may be densely disposed in the edge areas in which irradiance is relatively low and the areas in which the transparent blocks 126 are disposed such that uniformity of irradiance may be improved.

A ratio of the intervals R12 of the light emitting elements 132 disposed in the second sections Q21 and Q22 in the transverse direction to the intervals R11 of the light emitting elements 132 disposed in the first sections Q11 and Q12 in the transverse direction may be in a range of 1:0.62 to 1:0.83. As the ratio decreases, the intervals R11 of the light emitting elements 132 disposed in the first sections Q11 and Q12 in the transverse direction becomes dense.

When the ratio is less than 1:0.62, the light emitting elements disposed in the first section Q11 and Q12 are dense and thus irradiance is excessively high such that uniformity of irradiance may be degraded. Further, when the ratio is less than 1:0.83, the intervals of the light emitting elements disposed in the first section Q11 and Q12 are increased and thus irradiance becomes low such that the uniformity of the irradiance may be degraded.

For example, the intervals R11 of the light emitting elements 132 disposed in the first sections Q11 and Q12 in the transverse direction may each be 13.5 mm, and the intervals R12 of the light emitting elements 132 disposed in the second sections Q21 and Q22 in the transverse direction may each be 19.0 mm. However, these intervals may be appropriately adjusted according to the dimensions of the substrate 131.

A plurality of five-row disposed light emitting elements 132 may be disposed in each of the first sub-section Q11 and the second sub-section Q12 in the longitudinal direction. That is, widths of the first sub-section Q11 and the second sub-section Q12 in the transverse direction may be the same as each other. However, the widths may be varied according to a width of the transparent block 126. For example, when the width of the transparent block 126 is increased, the width of the second sub-section Q12 in which the transparent block 126 is disposed may be greater than the width of the first sub-section Q11 disposed in the edge area in proportion to the increase of the width of the transparent block 126.

The second section Q21 and Q22 may include a third sub-section Q21, which is disposed between the first sub-section Q11 and the second sub-section Q12, and a fourth sub-section Q22, which is disposed between adjacent second sub-sections Q12.

That is, the third sub-section Q21 may be a section between a side surface of the substrate 131 and the transparent block 126. The fourth sub-section Q22 may be a section between the transparent blocks 126. A width of the fourth sub-section Q22 in the transverse may be greater than a width of the third sub-section Q21. However, such an interval may be varied according to the dimensions of the substrate 131 and the number of the transparent blocks 126.

The substrate 131 may include a plurality of third sections Q31 and Q32 and a fourth section Q4 which are disposed in the longitudinal direction. Each of the third sections Q31 and Q32 and the fourth section Q4 may extend in the transverse direction. In this case, the third section Q31 and Q32 may include a fifth sub-section Q31, which is disposed on a first side surface 301 of the substrate 131, and a sixth sub section Q32, which is disposed on a third side surface 303 of the substrate 131.

The fourth section Q4 may be disposed between the fifth sub-section Q31 and the sixth sub-section Q32 in the longitudinal direction.

In this case, intervals R21 of the light emitting elements 132 disposed in the third sections Q31 and Q32 in the longitudinal direction may be narrower than intervals R22 of the light emitting elements 132 disposed in the fourth section Q4 in the longitudinal direction. That is, according to the present embodiment, the light emitting elements 132 may be densely disposed in the edge areas in which irradiance is relatively low such that uniformity of irradiance may be improved.

A ratio of the intervals R21 of the light emitting elements 132 disposed in the fourth section Q4 in the longitudinal direction to the intervals R11 of the light emitting elements 132 disposed in the third sections Q31 and Q32 in the longitudinal direction may be in a range of 1:0.62 to 1:0.83.

When the ratio is less than 1:0.62, the light emitting elements disposed in the third sections Q31 and Q32 are dense and thus irradiance becomes higher than that in the fourth section such that uniformity of irradiance may be degraded. Further, when the ratio is less than 1:0.83, the intervals of the light emitting elements disposed in the third sections Q31 and Q32 are increased and thus the irradiance becomes lower than that in the fourth section such that the uniformity of the irradiance may be degraded.

For example, the intervals R21 of the light emitting elements 132 disposed in the third sections Q31 and Q32 in the longitudinal direction may each be 13.5 mm, and the intervals R21 of the light emitting elements 132 disposed in the fourth section Q4 in the longitudinal direction may each be 19.5 mm. However, these intervals may be appropriately adjusted according to the dimensions of the substrate 131.

The substrate 131 may include fifth areas Q5 in which the first sections Q11 and Q12 intersect the third sections Q31 and Q32. The light emitting element 132 disposed in each of the fifth areas Q5 may be disposed most densely. That is, among corner areas in which four edge areas intersect and the areas in which the transparent block 126 are disposed, since irradiance of a portion close to the side surface of the substrate is lowest, much more of the light emitting elements 132 are disposed such that uniformity of irradiance may be improved.

The intervals R11 of the light emitting elements 132 disposed in the fifth area Q5 in the transverse direction may be equal to the intervals R21 thereof in the longitudinal direction. For example, the intervals R11 of the light emitting elements 132 disposed in the fifth area Q5 in the transverse direction and the intervals R21 thereof in the longitudinal direction may each be 13.5 mm, but these intervals may be appropriately adjusted according to the dimensions of the substrate 131.

Figure 15:
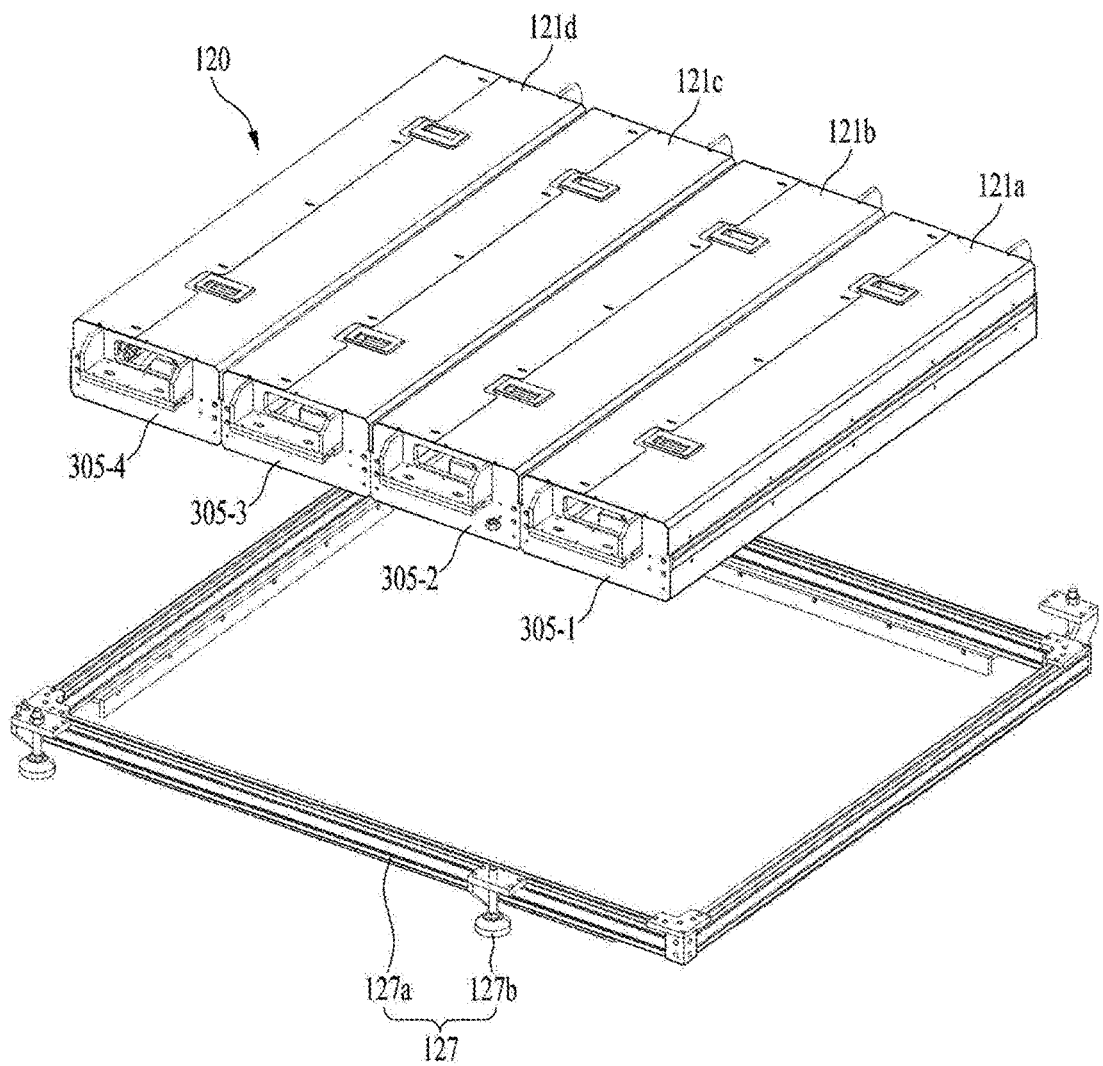
FIG. 15 is an exploded perspective view of the cooling part and a support frame which are shown in FIG. 2.
Figure 16:
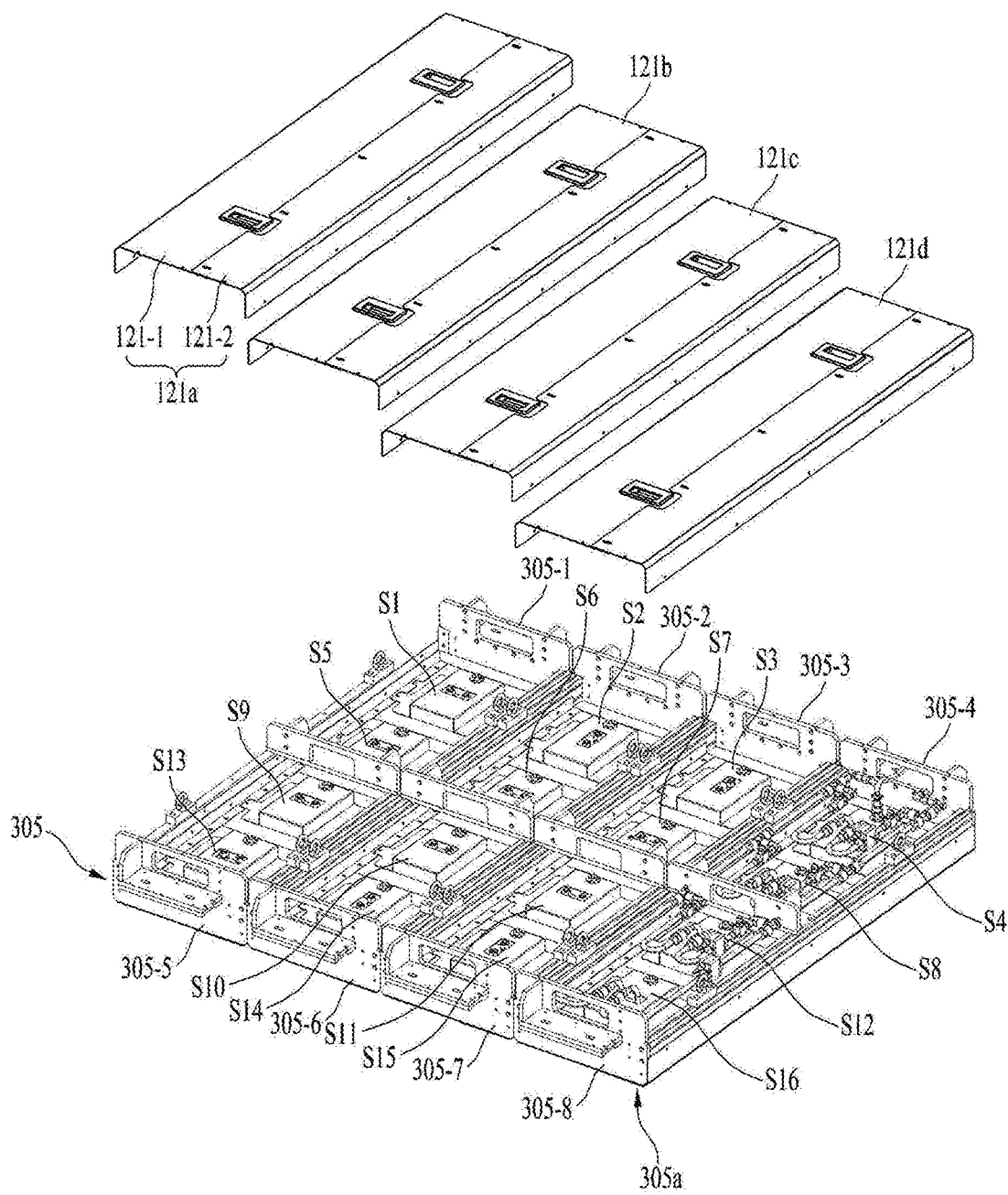
FIG. 16 is an exploded perspective view of the cooling part shown in FIG. 15.
Figure 17A:
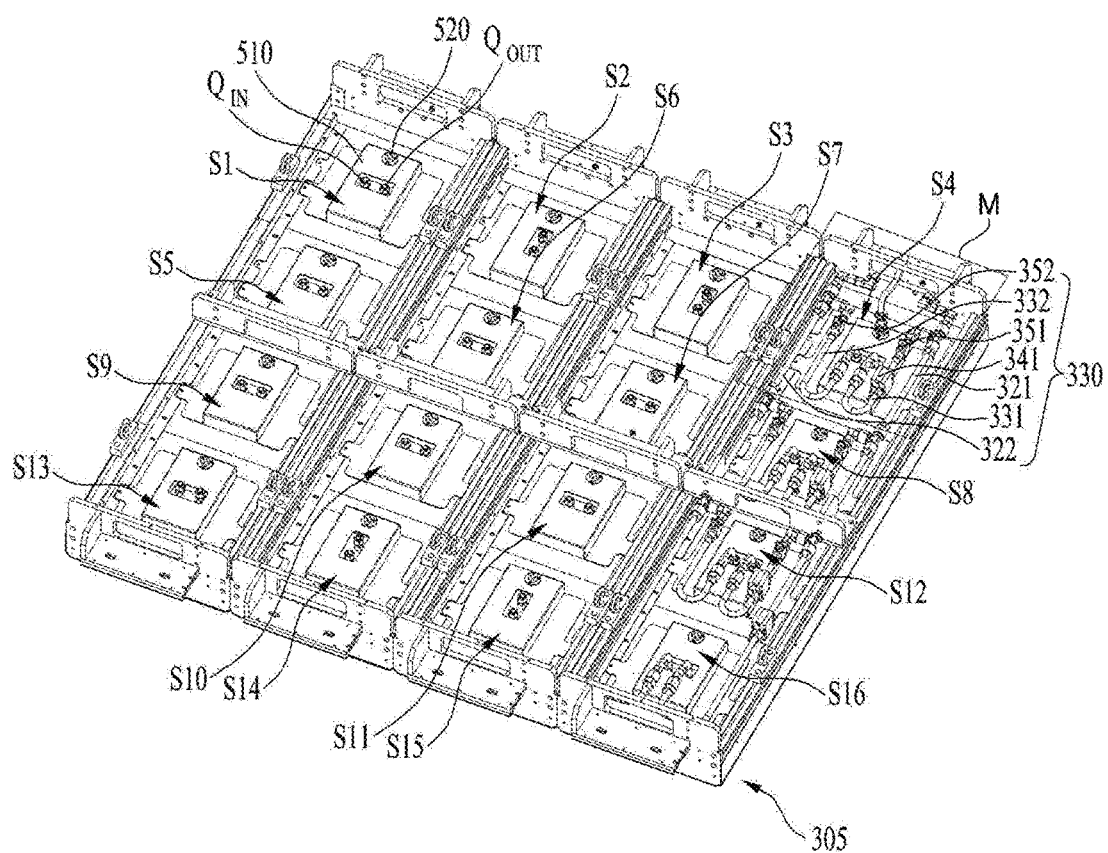
FIG. 17A is a perspective view of cooling blocks shown in FIG. 16.
Figure 17B:
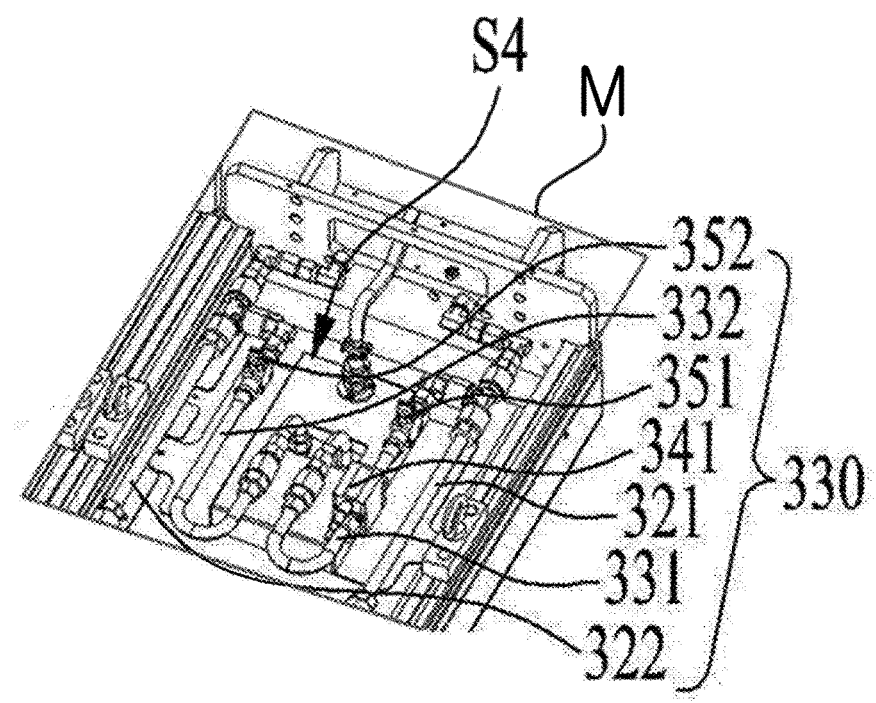
FIG. 17B is an enlarged diagram of a portion of FIG. 17A.
Figure 18:
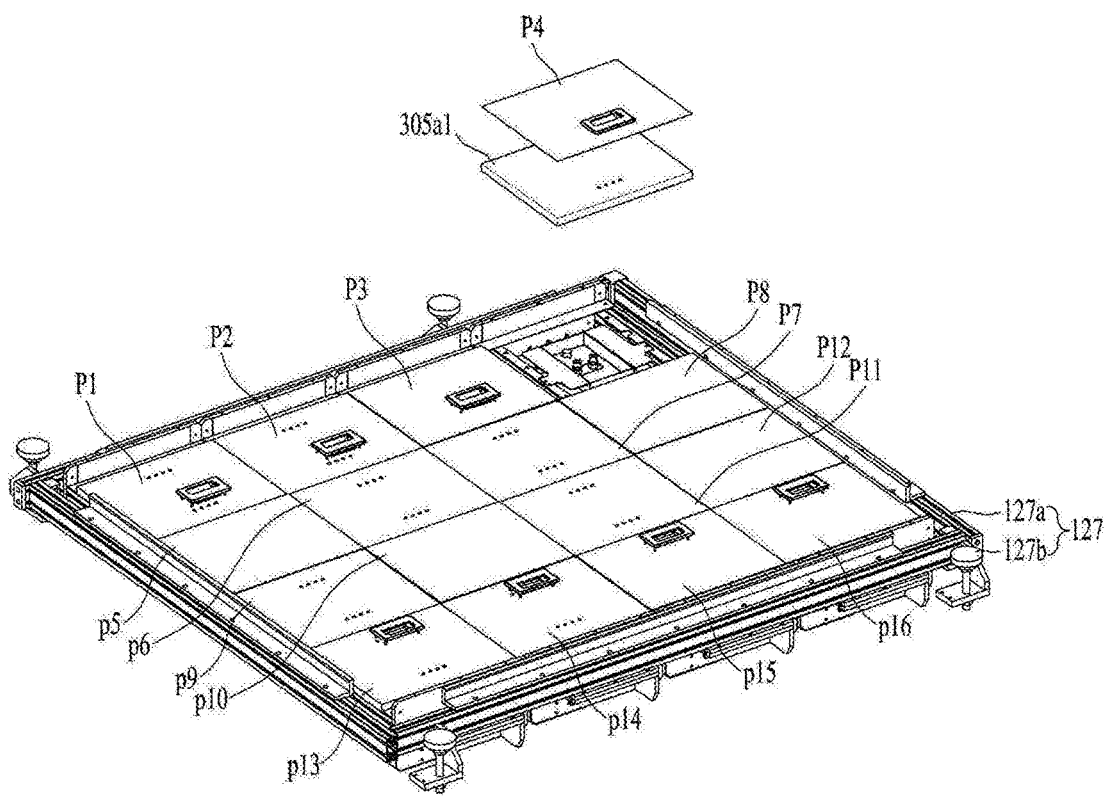
FIG. 18 is a bottom perspective view of the cooling blocks shown in FIG. 17A.

FIG. 15 is an exploded perspective view of the cooling part and the support frame which are shown in FIG. 2, FIG. 16 is an exploded perspective view of the cooling part shown in FIG. 15, FIG. 17A is a perspective view of cooling blocks shown in FIG. 16, FIG. 17B is an enlarged diagram of a portion of FIG. 17A, and FIG. 18 is a bottom perspective view of the cooling blocks shown in FIG. 17A.

Referring to FIGS. 15 to 18, the support frame 127 may include a frame 127a for supporting the cooling part 120, and at least one support 127b which is engaged with the frame 127a and seats the frame 127a on the transparent plate 125.

For example, the support frame 127 may have a shape, e.g., a quadrangular shape, which is the same as an outer circumferential surface of the cooling part 120.

The support 127b may be provided in plural. The plurality of supports 127b may be disposed to be spaced apart from each other. For example, the supports may each be in the form of a leg, but the present invention is not limited thereto.

The cooling part 120 may include a heat sink 305, a plurality of cooling blocks S1 to S16 disposed on the heat sink 305, a fluid adjusting part 330 for controlling supply of a fluid, e.g., cooling water, to the plurality of cooling blocks S1 to S16, and a plurality of cover members 121a to 121d which are coupled to the heat sink 305 and cover the cooling blocks S1 to S16 and the fluid adjusting part 330.

Each of the plurality of cooling blocks S1 to S16 may correspond to any one among the plurality of arrangement areas P1 to P16 of the substrate 131.

The heat sink 305 may include a bottom 305a and a plurality of side plates 305-1 to 305-8 disposed on side portions of the bottom 305a.

The cooling blocks S1 to S16 may be disposed on the bottom 305a of the heat sink 305.

As shown in FIG. 18, the bottom 305a of the heat sink 305 may be divided into a plurality of cooling blocks to correspond to the cooling blocks S1 to S16.

For example, the heat sink 305 may include bottoms 305a1 corresponding to the cooling blocks S1 to S16. The bottom 305a1 of the heat sink 305 may become a bottom of a main body 510 corresponding to any one among the cooling blocks S1 to S16.

The first and second light emitting elements 132a and 132b may be disposed on a first surface of the substrate 131 of the light emitting module 130, and the substrate 131 may be disposed below the bottom 305a1 of the heat sink 305 so as to allow a second surface of the substrate 131 to be in contact with the bottom 305a1 of the heat sink 305. The first surface and the second surface of the substrate 131 may be opposite to each other.

The substrate 131 may be divided into the plurality of arrangement areas P1 to P16, and the plurality of arrangement areas P1 to P16 may be separated or divided from each other.

Each of the plurality of arrangement areas P1 to P16 may correspond to any one among the bottoms of the heat sink 305. For example, a second surface of each of the plurality of arrangement areas P1 to P16 may be in contact with a corresponding one among the bottoms of the heat sink 305.

Referring to FIG. 17A, each of the plurality of cooling blocks S1 to S16 may include the main body 510, an inlet QIN, and an outlet QOUT.

The inlet QIN may be disposed in one area of the main body 510 and may be a passage for introducing or putting a fluid into the main body 510. The outlet QOUT may be spaced apart from the inlet QIN to be disposed in another area of the main body 510 and may be a passage for discharging the fluid from an inside of the main body 510 to the outside.

The main body 510 provides a flow path for allowing the fluid, which is introduced through the inlet QIN, to flow. The fluid flowing inside the main body 510 may be discharged to the outside of the main body 510 through the outlet QOUT.

Figure 19:
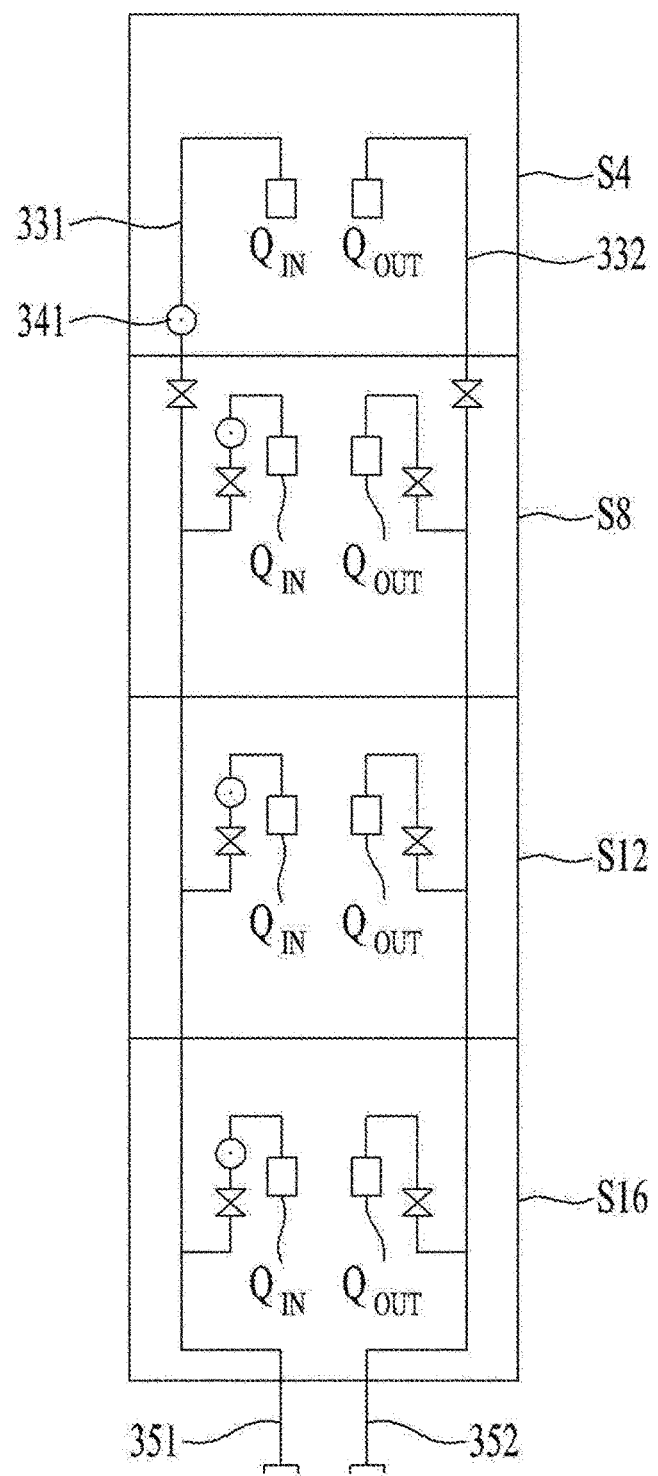
FIG. 19 is a schematic diagram illustrating a fluid adjusting part for supplying a fluid to the cooling blocks shown in FIG. 17A.

FIG. 19 is a schematic diagram illustrating the fluid adjusting part 330 for supplying a fluid to the cooling blocks S4, S8, S12, and S16 shown in FIG. 17A.

Referring to FIGS. 17A to 19, the fluid adjusting part 330 may include a fluid supply pipe 321 through which a fluid is supplied from the outside, a first connection pipe 331 which connects the fluid supply pipe 321 to the inlet QIN, a flow rate sensor 341 installed on the first connection pipe 331, a fluid discharge pipe 322 for discharging the fluid, and a second connection pipe 332 which connects the fluid discharge pipe 322 to the outlet QOUT.

The fluid adjusting part 330 may further include a first valve 351 and a second valve 352.

The first valve 351 may be installed on the first connection pipe 331 and located between the flow rate sensor 341 and the fluid supply pipe 321 to adjust a flow rate introduced into the inlet QIN through the first connection pipe 331.

The second valve 352 may be installed on the second connection pipe 332 and may control a flow rate discharged to the fluid discharge pipe 322 through the second connection pipe 332.

The cooling blocks S1 to S16 corresponding to the arrangement areas P1 to P16 may be disposed in the form of a matrix comprised of rows and columns, but the present invention is not limited thereto.

For example, the fluid adjusting part 330 may include a plurality of fluid supply pipes and a plurality of fluid discharge pipes. A pair of the fluid supply pipe 321 and the fluid discharge pipe 322 may be disposed to correspond to the cooling block included in each row.

Although only the fluid adjusting part for each of the cooling blocks S4, S8, S12, and S16 included in the last rows has been illustrated in FIG. 17A, the above description in FIG. 17A may also be equally applied to the fluid adjusting part for each of the cooling blocks included in the rows.

For example, the pair of the fluid supply pipe 321 and the fluid discharge pipe 322 may be shared by the cooling blocks included in each row. Alternatively, the first connection pipe 331, the second connection pipe 332, the first and second valves 351 and 352, and the flow rate sensor 341 may be provided in each of the cooling blocks. Further, owing to the above independent and individual configuration, when a problem occurs due to a failure or damage to parts such as the first connection pipe 331, the second connection pipe 332, the first and second valves 351 and 352, and the flow rate sensor 341, only the part in which the problem occurs may be replaced individually.

Figure 20:
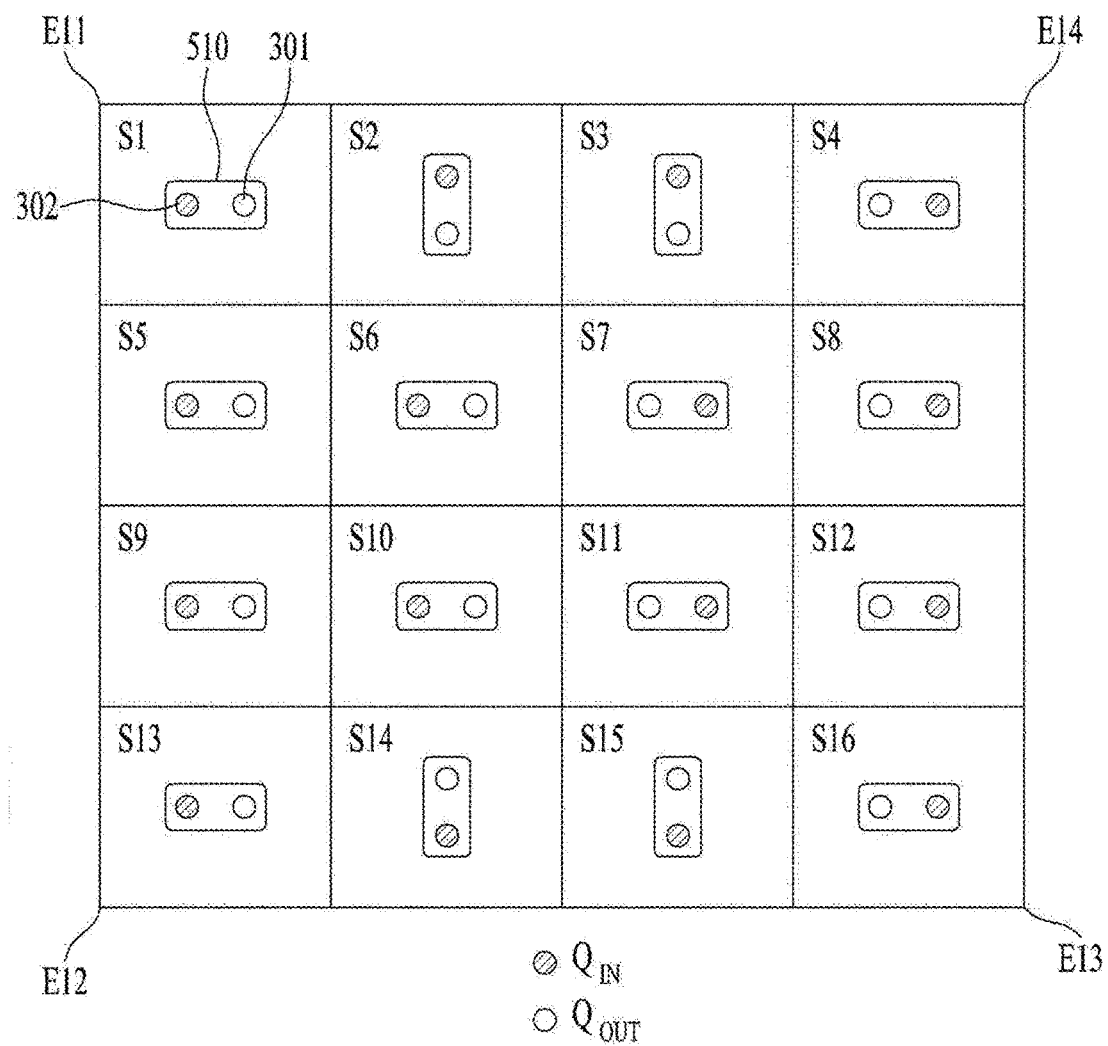
FIG. 20 is a schematic diagram illustrating an arrangement of inlets and outlets of the cooling blocks shown in FIG. 17A.

FIG. 20 is a schematic diagram illustrating an arrangement of inlets and outlets of the cooling blocks shown in FIG. 17A.

Referring to FIG. 20, the cooling blocks S1 to S16 may include first cooling blocks S1, S4, S13, and S16 corresponding to the first arrangement areas P1, P4, P13, and P16 of FIG. 1, second cooling blocks S2, S3, S5, S8, S9, S12, S14, and S15 corresponding to the second arrangement areas P2, P3, P5, P8, P9, P12, P14, and P15, and third cooling blocks S6, S7, S10, and S11 corresponding to the third arrangement areas P6, P7, P10, and P11.

The first cooling blocks S1, S4, S13, and S16 may include the vertexes E11 to E14 corresponding to vertexes of the first arrangement areas P1, P4, P13, and P16.

The inlet QIN of each of the first cooling blocks S1, S4, S13 and S16 may be disposed to be close to a corresponding one among the vertexes E11 to E14 instead of the outlet QOUT.

For example, the inlet QIN and the outlet QOUT of each of the first cooling blocks S1, S4, S13, and S16 may be disposed in the row direction of the cooling blocks S1 to S16. The inlet QIN may be disposed closer to a corresponding vertex than the outlet QOUT.

In FIG. 20, the inlet QIN and the outlet QOUT of each of the first cooling blocks S1, S4, S13, and S16 are disposed in the row direction, but the present invention is not limited thereto. Alternatively, the inlet QIN and the outlet QOUT of each of the first cooling blocks S1, S4, S13, and S16 may be disposed in the column direction of the cooling blocks S1 to S16.

Also alternatively, the inlet QIN and the outlet QOUT of each of the first cooling blocks S1, S4, S13, and S16 may be disposed in a diagonal direction. Here, the diagonal direction may be a direction parallel to a straight line connecting each of vertexes E11 to E14 of the first cooling blocks S1, S4, S13, and S16 to another vertex opposite to each of vertexes E11 to E14.

A temperature of cooling water introduced into the inlet QIN is lower than a temperature of cooling water discharged through the outlet QOUT. This is because the cooling water flowing in the main body 510 absorbs heat generated from the first and second light emitting elements 132a and 132b.

In each of the first arrangement areas P1, P4, P13, and P16, since an arrangement density of the first and second light emitting elements in areas adjacent to the vertexes E1 to E4 is higher than an arrangement density of the first and second light emitting elements in the remaining areas, a relatively large amount of heat may be generated.

A temperature gradient due to the heat generated from the first and second light emitting elements may occur with respect to each of the first arrangement areas P1, P4, P13, and P16 such that uniformity of irradiance may be degraded. This is because irradiance values of light generated from the first and second light emitting elements 132a and 132b may be varied according to a temperature, and arrangement densities of the first and second light emitting elements 132a and 132b are high in areas adjacent to the vertexes in the first arrangement areas P1, P4, P13, and P16.

According to the present embodiment, positions of the inlets QIN are disposed to be close to the vertexes E1 to E4 of the first arrangement areas P1, P4, P13, and P16 which generate heat relatively such that it is possible to lower a temperature gradient, thereby preventing degradation of uniformity of irradiance, which will be generated due to the temperature gradient. This is because the temperature of the cooling water flowing inside a main body 510 adjacent to the inlet QIN is lower than the temperature of the cooling water flowing inside a main body 510 adjacent to the outlet QOUT.

That is, according to the present embodiment, temperatures of the first and second light emitting elements of the light emitting module which implements a surface light source are maintained constantly such that it is possible to prevent degradation of an optical characteristic and a service life according to portions of the curing target.

Further, in order to lower a temperature gradient in each of the second arrangement areas P2, P3, P5, P8, P9, P12, P14, and P15, the inlets QIN may be disposed to be closer to side surfaces of the second cooling blocks S2, S3, S5, S8, S9, S12, S14, and S15 corresponding to the side surfaces of the substrate 131 than the outlets QOUT.

For example, the inlet QIN and the outlet QOUT of each of the second cooling blocks S2, S3, S5, S8, S9, S12, S14, and S15 may be disposed in parallel with the row direction or the column direction of the cooling blocks S1 to S16.

The inlet QOUT and the outlet QOUT of each of the third cooling blocks S6, S7, S10, and S11 may be disposed in a direction parallel to the row direction or the column direction of the cooling blocks S1 to S16.

The controller 150 may provide a drive signal or power to drive the first light emitting elements 132a and the second light emitting elements 132b of the light emitting module 130.

For example, the controller 150 may separately drive the first and second light emitting elements 132a and 132b disposed in the arrangement areas P1 to P16 according to arrangement areas.

The controller 150 may control a supply of cooling water to the cooling part 120 or a discharge of the cooling water from the cooling part 120 through the cooling water pipes 160 connected to the fluid supply pipe 321 and the fluid discharge pipe 322 of the cooling part 120.

The ultraviolet curing device 100 may further include wires or cables which electrically connect the controller 150 to the first and second light emitting elements 132a and 132b of the light emitting module 130.

For example, as shown in FIGS. 17A and 18, the ultraviolet curing device 100 may have terminals 520 electrically connected to the first and second light emitting elements 132a and 132b which pass through the main bodies 510 of the cooling blocks S1 to S16 to be disposed in a corresponding one among the arrangement areas P1 to P16 of the substrate 131.

A wire (or cable) may be connected to each of the terminals 520. The wires (or cables) connected to the terminals 520 may be electrically connected to the controller 150.

The controller 150 may provide drive signals or power to the first and second light emitting elements 132a and 132b disposed in each of the arrangement areas P1 to P16 of the substrate 131 through the wires.

The ultraviolet curing device 100 may further include a display 170 for displaying a flow rate of the cooling water measured by the flow rate sensor 341 included in each of the cooling blocks S1 to S16.

As described above, according to the present embodiment, in order to improve uniformity of irradiance, the separation distances between the first and second light emitting elements 132a and 132b disposed in each of the arrangement areas P1 to P16 are optimized through simulation such that uniformity of light irradiated to an overall area of a curing target may be improved.

Further, according to the present embodiment, in consideration of the above-described arrangement of the first and second light emitting elements 132a and 132b in each of the arrangement areas P1 to P16, the inlets QIN and the outlets QOUT of the cooling blocks S1 to S16 of the cooling part 120 are disposed as described in FIG. 20 such that the temperature gradient is lowered and thus it is possible to prevent degradation of the uniformity of the irradiance of the ultraviolet curing device 100.

Figure 21:
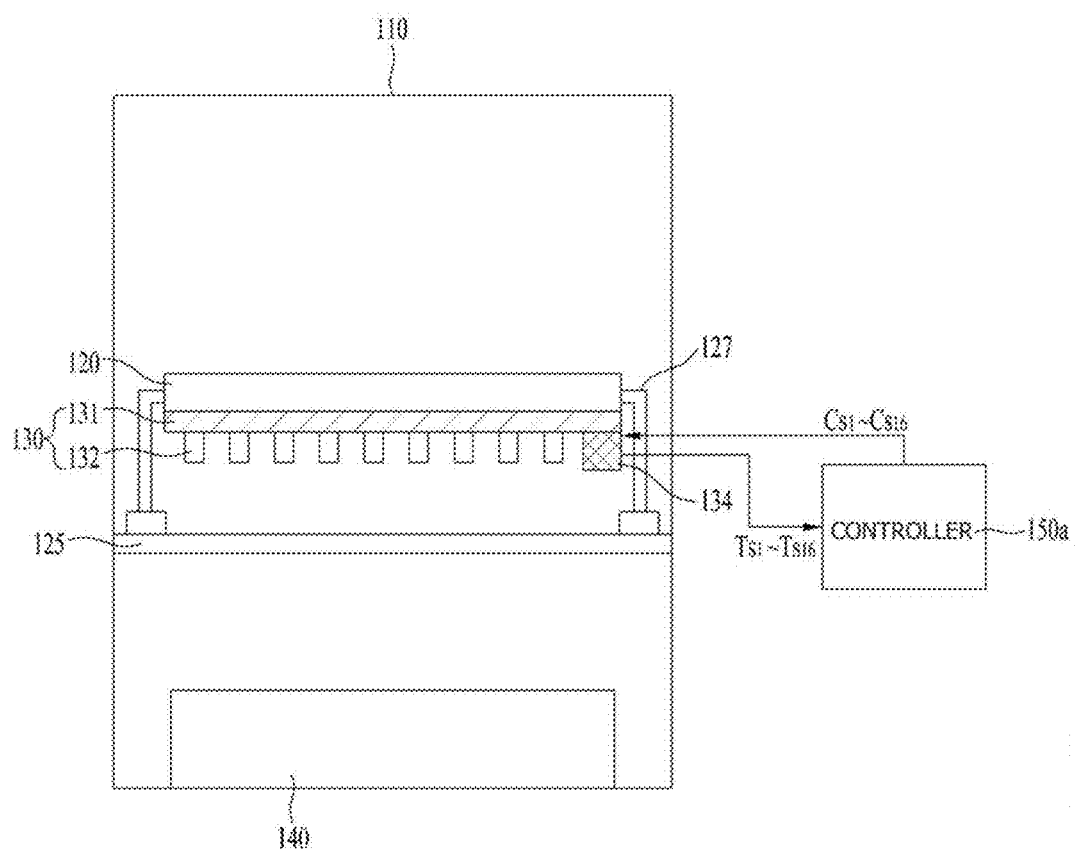
FIG. 21 is a configurational diagram illustrating an ultraviolet curing device according to another embodiment.

FIG. 21 is a configurational diagram illustrating an ultraviolet curing device according to another embodiment.

The same reference numerals as in FIG. 1 denote the same components, and descriptions of the same components will be simplified or omitted.

Referring to FIG. 21, a UV curing device 100-1 may include a case 110, a cooling part 120, a transparent plate 125, a support frame 127, a light emitting module 130, a temperature sensor 134, a stage 140, and a controller 150a.

The temperature sensor 134 may detect temperature information on a temperature of the light emitting module 130. For example, the temperature sensor 134 may be disposed on the substrate 131 and may detect temperature information on a temperature of the substrate 131 or temperatures of the first and second light emitting elements 132a and 132b due to heat generated from the first and second light emitting elements 132a and 132b.

For example, the temperature sensor 134 may be implemented as a sensor of which resistance value varies according to a temperature, but the present invention is not limited thereto.

For example, the temperature sensor 134 may be disposed in at least one among the arrangement areas P1 to P16.

For example, a plurality of temperature sensors 134 may be provided. Each of the plurality of temperature sensors 134 may be disposed in a corresponding one among the first arrangement areas P1 to P16.

For example, each of the plurality of temperature sensors 134 may transmit temperature information Ts1 to Ts16 on the temperatures of the first and second light emitting elements 132a0 and 132b, which are disposed in a corresponding one among the arrangement areas P1 to P16, to the controller 150a.

The controller 150a may generate drive signals Cs1 to Cs16 for separately driving the first and second light emitting elements disposed in each of the arrangement areas P1 to P16 using the temperature information Ts1 to Ts16 provided from the temperature sensors 134 and provide the generated drive signals Cs1 to Cs16 to the first and second light emitting elements disposed in a corresponding one among the arrangement areas P1 to P16. For example, the drive signals Cs1 to Cs16 may each be in the form of a current, but the present invention is not limited thereto, and the drive signals Cs1 to Cs16 may each be in the form of a voltage.

For example, the controller 150a may set or adjust a slope of a corresponding one among the plurality of drive signals Cs1 to Cs16 on the basis of the temperature information Ts1 to Ts16.

Alternatively, the temperature sensor 134 may include two or more temperature sensors which are disposed to be spaced apart from each other in at least one among the arrangement areas P1 to P16.

For example, the temperature sensor 134 may include two or more temperature sensors which are disposed to be spaced apart from each other in each of the first arrangement areas P1, P4, P13, and P16.

For example, the two or more temperature sensors may include a first temperature sensor disposed in a first area in each of the first arrangement areas P1, P4, P13, and P16, and a first temperature sensor disposed in a second area in each of the first arrangement areas P1, P4, P13, and P16.

A first area 201 (see FIG. 3) may be an area which is adjacent to each of the edges E1 to E4 of the first arrangement areas P1, P4, P13, and P16 and in which separation distances between two adjacent first and second light emitting elements are not uniform or are not the same as each other.

A second area 202 (see FIG. 3) may be an area which is the remaining area except for the first area and in which two adjacent first and second light emitting elements are disposed at regular intervals.

The controller 150a may detect temperature information corresponding to at least one arrangement area (e.g., P1, P4, P13, or P16) on the basis of first temperature information received from the first temperature sensor and second temperature information received from the second temperature sensor.

For example, the controller 150a may calculate an average value of the first temperature information and the second temperature information and set or vary slopes of drive signals for driving the first and second light emitting elements disposed in at least one arrangement area (e.g., P1, P4, P13, or P16) on the basis of the calculated average value.

Since an arrangement density of the first and second light emitting elements with respect to the first area 201 is different from arrangement density of the first and second light emitting elements with respect to the second area 202, a deviation in temperature between the first area 201 and the second area 202 may occur such that a deviation of an irradiance value may occur. According to the present invention, the average value of the first temperature information and the second temperature information is used such that it is possible to reduce the deviation of the irradiance value. Consequently, the uniformity of the irradiance of the light emitting module may be further improved.

Figure 24A:
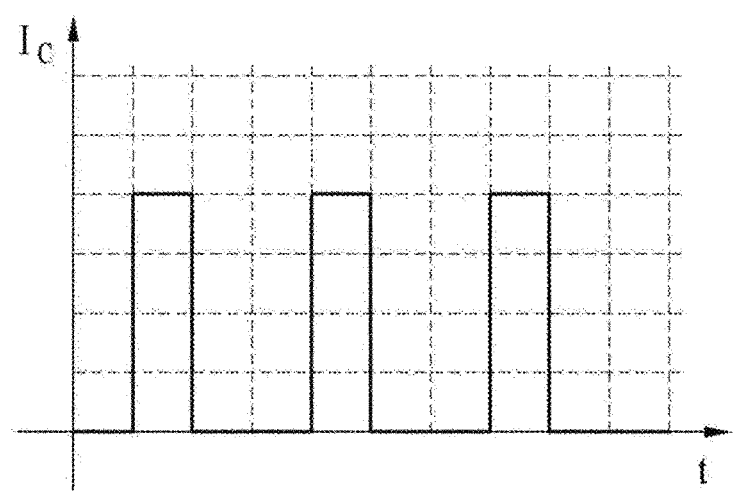
FIG. 24A is a diagram illustrating a general drive signal of the first light emitting element or the second light emitting element.
Figure 24B:
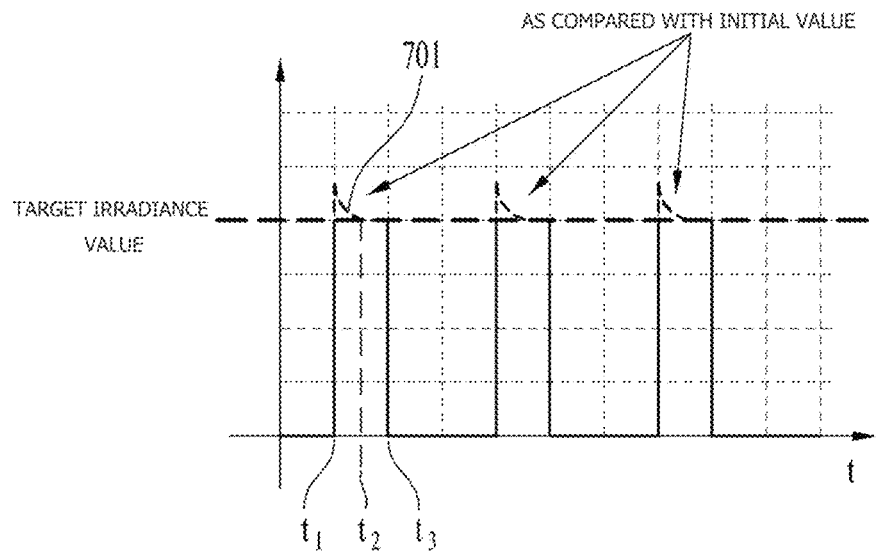
FIG. 24B is a diagram illustrating irradiance of the first light emitting element or the second light emitting element according to the drive signal of FIG. 24A.

FIG. 24A is a diagram illustrating a general drive signal Ic of the first light emitting element or the second light emitting element, and FIG. 24B is a diagram illustrating irradiance of the first light emitting element or the second light emitting element according to the drive signal Ic of FIG. 24A. In FIGS. 24A and 24B, an x axis may be a time axis, a y axis in FIG. 24A may be a current value of the drive signal, and a y axis in FIG. 24B may be an irradiance value of the first light emitting element or the second light emitting element.

Referring to FIGS. 24A and 24B, the drive signal Ic may be generally a pulse waveform. In general, when a temperature of the light emitting diode rises, a quantity of light is decreased and thus the irradiance value may be decreased.

Therefore, since a temperature of the first light emitting element or the second light emitting element is lowest immediately after the first light emitting element or the second light emitting element emits light due to the drive signal, the irradiance value of the first light emitting element or the second light emitting element is the highest.

Further, during a first period between t1 and t2, since the temperature of the first light emitting element or the second light emitting element gradually rises, the irradiance value of the first light emitting element or the second light emitting element is gradually decreased.

During a second period between t2 and t3 after the first period between t1 and t2, since the temperature of the first light emitting element or the second light emitting element no longer rises, the irradiance of the first light emitting element or the second light emitting element may be kept constant, or even when the temperature of the first light emitting element or the second light emitting element rises, the irradiance value may no longer be decreased but may be kept constant.

In the first period between t1 and t2, since the irradiance value of the first light emitting element or the second light emitting element is not constant and varies according to a variation in temperature change, the uniformity of the irradiance of the light emitting module may be degraded. That is, as shown by a dotted line 701 in FIG. 24B, during the first period between t1 and t2, the irradiance value of the first light emitting element or the second light emitting element may be higher than a target irradiance value.

Figure 22:
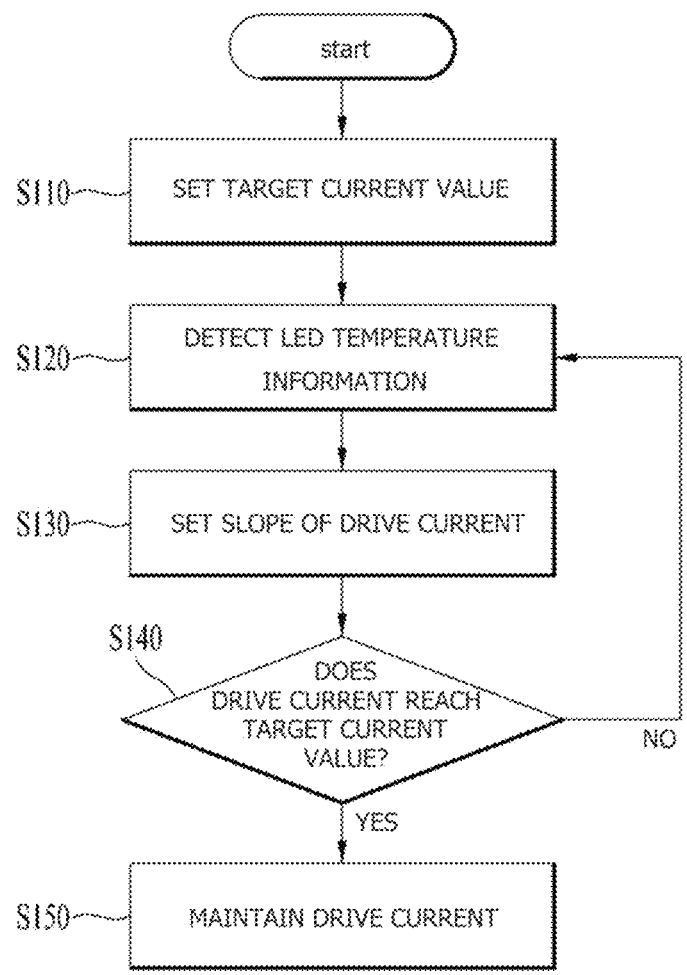
FIG. 22 is a flowchart illustrating a method of controlling a slope of a magnitude of a drive signal of a light emitting module by a controller shown in FIG. 21.

FIG. 22 is a flowchart illustrating a method of controlling a slope of a magnitude of a drive signal of the light emitting module 130 of the controller shown in FIG. 21.

Referring to FIG. 22, a target value with respect to a magnitude of the drive signals for driving the first light emitting elements 132a or the first light emitting elements 132b may be set using the controller 130.

For example, the target value may be a current value of the drive signal for driving the first light emitting element or the second light emitting element so as to generate a desired target irradiance value (S110).

Next, the temperature information Cs1 to Cs16 on the temperatures of the first light emitting elements 132a and the second light emitting elements 132b disposed in the arrangement areas P1 to P16 are detected using the temperature sensors 134 (S120).

For example, the temperatures of the arrangement areas P1 to P16 may be detected using the temperature sensors 134 disposed in the arrangement areas P1 to P16, and the temperature information Cs1 to Cs16 on the temperatures of the first light emitting elements 132a and the second light emitting elements 132b may be detected on the basis of the detected temperatures.

Next, the controller 150 may set the slopes of the drive signals (e.g., drive currents) on the basis of the detected temperature information Cs1 to Cs16. Here, the slope of the drive signal may be a variance in current value over time. For example, a current value of the drive signal (e.g., the drive current) may be set on the basis of the detected temperature information Cs1 to Cs16.

When the detected temperature is low, the slope of the drive signal may be set to be high. For example, the variance in current value of the drive signal with respect to a unit time may be set to be large according to the detected temperature.

On the other hand, as the detected temperature gradually rises, the slope of the magnitude of the drive signal may be gradually set to be low. For example, the variance in current value of the drive signal with respect to a unit time may be set to be small according to the detected temperature.

Next, the controller 150 determines whether a magnitude (e.g., the current value) of the drive signal having the set slope reaches a target value (e.g., the target current value) (S140).

For example, when the current value of the drive signal does not reach the target current value, the above-described operations S120 to S140 may be performed repeatedly.

Otherwise, when the current value of the drive signal reaches the target current value, the set slope and the set current value of the drive signal are maintained (S150).

Until the magnitude of the drive signal reaches the target value, the controller 150 may vary the slope of the drive signal on the basis of the temperature information.

The controller 150 may generate a plurality of drive signals corresponding to a plurality of arrangement areas. The plurality of drive signals may drive the first and second light emitting elements arranged in a corresponding one among the plurality of arrangement areas. The controller 150 may individually and independently drive the first and second light emitting elements according to the arrangement areas due to the plurality of driving signals.

Figure 23:
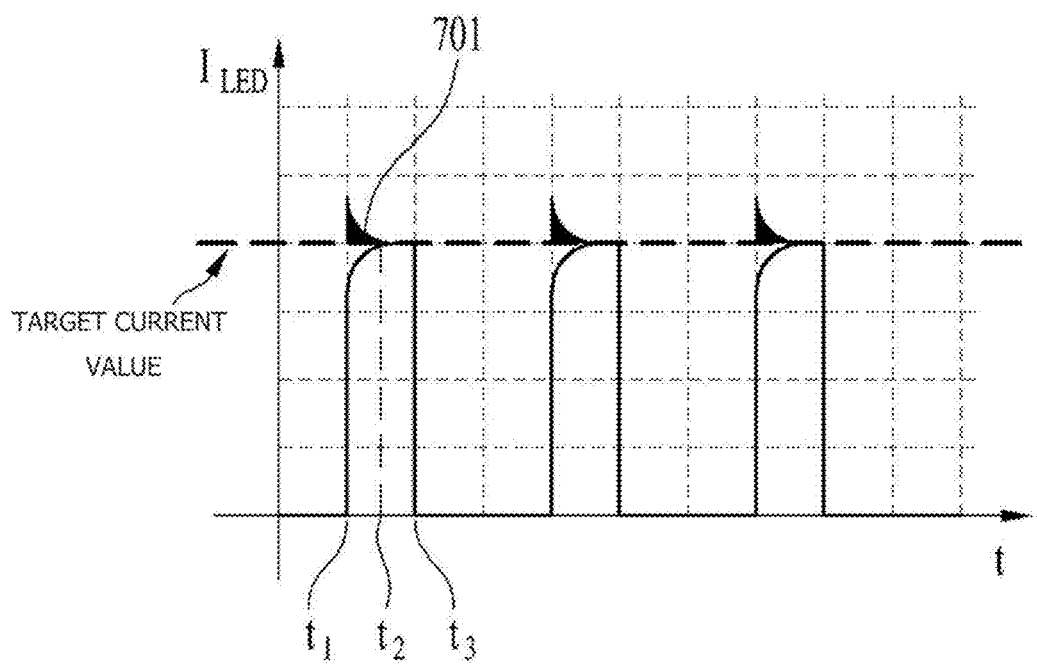
FIG. 23 is a diagram illustrating a waveform of the drive signal generated by the method shown in FIG. 22.

FIG. 23 is a diagram illustrating a waveform of the drive signal generated by the method shown in FIG. 22.

Referring to FIG. 23, as described above in FIGS. 4A and 4B, since the temperatures of the first light emitting element and the second light emitting element are low during the first period between t1 and t4, the irradiance values of the first light emitting element and the second light emitting element are higher than the target irradiance value.

During the first period between t1 and t2, the controller 150 repeatedly performs operations S120 to S140 to vary a slope of a waveform of a drive signal ILED as shown in FIG. 23.

For example, during the first period between t1 and t2 of the drive signal, the controller 150a may reduce the slope of the drive signal on the basis of the temperature information. For example, the first period between t1 and t2 may be a period from a turn-on timing of the first and second light emitting elements 132a and 132b to a timing at which the magnitude (e.g., the current value) of the drive signal reaches the target value (e.g., the target current value).

For example, during the first period between t1 and t2, the controller 150a may non-linearly reduce the slope of the drive signal.

Further, for example, during the second period between t2 and t3, the controller 150a may constantly maintain the magnitude (e.g., the current value) of the drive signal at the target value (e.g., the target current value). The second period between t2 and t3 may be a period from a timing at which the magnitude (e.g., the current value) of the drive signal reaches the target value (e.g., the target current value) to a timing at which the first and second light emitting elements 132a and 132b are turned off.

Since the current value of the drive signal ILED is less than the target current value during the first period between t1 and t2 and the drive signal ILED has a variation in slope corresponding to the variation in temperature of the first light emitting element 132a and the second light emitting element 132b, the irradiance values of the first light emitting element 132a and the second light emitting element 132b in the first period between t1 and t2 may each be equal to the target irradiance value or may each be adjusted to have a value that is close to the target irradiance value.

That is, according to the present embodiment, during the first period between t1 and t3, a surplus irradiance 701 exceeding the target irradiance value described in FIG. 4B does not occur.

Consequently, even though the temperatures of the first and second light emitting elements 132a and 132b vary, the irradiance values of the first and second light emitting elements 132a and 132b may be kept constant during the first period between t1 and t2 and the second period between t2 and t3, and the uniformity of the irradiance of the light emitting module may be secured regardless of the temperatures. That is, according to the present embodiment, it is possible to prevent degradation of the uniformity of the irradiance of the light emitting module 130 according to the variation in temperature of the first and second light emitting elements 132a and 132b.

The features, structures, effects, and the like described in the above embodiments are included in at least one embodiment of the present invention and are not necessarily limited to one embodiment. Further, the features, structures, effects, and the like illustrated in each of the embodiments can be practiced by being combined and modified into another embodiment by those skilled in the art to which the embodiments pertain. Therefore, it should be construed that descriptions relating to these combinations and modifications fall within the scope of the present invention.

The invention claimed is:

1. A curing device comprising:
    a stage;
    a light emitting module including a substrate disposed on the stage, and a plurality of light emitting elements disposed on the substrate; and
    a plurality of transparent blocks disposed between the light emitting module and the stage,
    wherein the substrate includes a plurality of first sections and a plurality of second sections, which are disposed in a first direction,
    wherein the plurality of transparent blocks are disposed in the first section, and wherein an interval of the light emitting elements disposed in the first section in the first direction is narrower than an interval of the light emitting elements disposed in the second section in the first direction.

2. The curing device of claim 1, wherein the plurality of transparent blocks extend in a direction perpendicular to the first direction.

3. The curing device of claim 1, wherein the plurality of first sections and the plurality of second sections are alternately disposed in the first direction.

4. The curing device of claim 1, wherein the plurality of first sections and the plurality of second sections extend in a second direction perpendicular to the first direction.

5. The curing device of claim 1, wherein:
the substrate includes a plurality of third sections and a plurality of fourth sections, which are disposed in a second direction perpendicular to the first direction; and
an interval of the light emitting elements disposed in the third section in the second direction is narrower than an interval of the light emitting elements disposed in the fourth section in the second direction.

6. The curing device of claim 5, wherein each of the plurality of fourth sections is disposed between two third sections which are disposed on an edge of the substrate.

7. The curing device of claim 1, wherein the plurality of transparent blocks fix a mask pattern of a curing target which is seated on the stage.

8. The curing device of claim 5, wherein:
the substrate includes a fifth area in which the first section intersects the third section; and
the number of the plurality of light emitting elements disposed in the fifth area is largest per unit area.

9. The curing device of claim 8, wherein an interval in the first direction and an interval in the second direction of the plurality of light emitting elements disposed in the fifth area are the same as each other.

10. The curing device of claim 5, wherein a ratio of an interval of the plurality of light emitting elements disposed in the second section in the first direction to an interval of the plurality of light emitting elements disposed in the first section in the first direction is in a range of 1:0.62 to 1:0.83.

11. The curing device of claim 5, wherein a ratio of an interval of the plurality of light emitting elements disposed in a fourth section in a second direction to an interval of the plurality of light emitting elements disposed in a third section in the second direction is in a range of 1:0.62 to 1:0.83.

12. The curing device of claim 1, wherein:
the light emitting element includes a first light emitting element configured to emit light of a first wavelength range and a second light emitting element configured to emit light of a second wavelength range which is different from the first wavelength range; and
the first light emitting element and the second light emitting element are alternately disposed in the first direction and a second direction perpendicular to the first direction.

13. The curing device of claim 1, further comprising:
at least one temperature sensor configured to detect temperature information on the plurality of the light emitting elements; and
a controller configured to set a slope of a drive signal for driving the plurality of the light emitting elements on the basis of the temperature information;
wherein the controller sets a target value and changes the slope of the drive signal on the basis of the temperature information until a magnitude of the drive signal reaches the target value.

14. The curing device of claim 13, wherein the substrate comprises a plurality of arrangement areas of a matrix shape,
wherein the plurality of light emitting elements is disposed on the plurality of arrangement areas,
wherein the at least one temperature sensor comprises the plurality of temperature sensors detecting temperature of the plurality of arrangement areas.

15. The curing device of claim 13, wherein the controller generates a plurality of drive signals for individually controlling driving of the light emitting elements according to the arrangement areas.

16. The curing device of claim 14, wherein the plurality of the temperature sensors includes a first temperature sensor disposed in a first area of at least one arrangement area and a second temperature sensor disposed in a second region of the at least one arrangement area, and
wherein the first area is an area which is adjacent to one corner of the at least one arrangement area and the second region is the remaining area except for the first area.

17. The curing device of claim 16, wherein the controller calculates an average value of the first temperature information of the first temperature sensor and the second temperature information of the second temperature sensor, and
wherein the controller sets slopes of the drive signals for driving the light emitting elements disposed in the at least one arrangement area on the basis of the calculated average value.

18. The curing device of claim 14, further comprising a plurality of cooling blocks corresponding to the plurality of arrangement areas.

19. The curing device of claim 18, wherein a size of each of the plurality of cooling blocks correspond a size of each of the plurality of arrangement areas.

20. The curing device of claim 18, wherein further comprising;
a fluid supply pipe connected to an inlet of the plurality of cooling blocks; and
a fluid discharge pipe connected to an outlet of the plurality of cooling blocks.

\* \* \* \* \*